United States Patent
Yi et al.

(10) Patent No.: US 8,865,322 B2
(45) Date of Patent: Oct. 21, 2014

(54) DENDRIMER AND ORGANIC LIGHT-EMITTING DEVICE USING THE SAME

(75) Inventors: Jeoung-In Yi, Yongin (KR); Yoon-Hyun Kwak, Yongin (KR); Seung-Gak Yang, Yongin (KR); Hee-Yeon Kim, Yongin (KR); Jae-Yong Lee, Yongin (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 634 days.

(21) Appl. No.: 13/179,072

(22) Filed: Jul. 8, 2011

(65) Prior Publication Data

US 2012/0013247 A1   Jan. 19, 2012

(30) Foreign Application Priority Data

Jul. 16, 2010 (KR) .................. 10-2010-0069169

(51) Int. Cl.
| | |
|---|---|
| C07D 209/88 | (2006.01) |
| C07D 251/24 | (2006.01) |
| H01L 51/54 | (2006.01) |
| C08G 83/00 | (2006.01) |
| H01L 51/00 | (2006.01) |
| H01L 51/50 | (2006.01) |

(52) U.S. Cl.
CPC .......... C08G 83/002 (2013.01); H01L 51/5056 (2013.01); H01L 51/0061 (2013.01); H01L 51/0072 (2013.01); H01L 51/0037 (2013.01); H01L 51/006 (2013.01); H01L 51/0095 (2013.01); H01L 51/0081 (2013.01); H01L 51/005 (2013.01); H01L 51/0067 (2013.01); Y10S 428/917 (2013.01)
USPC ........... 428/690; 428/917; 313/504; 313/506; 548/442; 544/180

(58) Field of Classification Search
None
See application file for complete search history.

(56) References Cited

U.S. PATENT DOCUMENTS

| | | | |
|---|---|---|---|
| 7,737,627 B2 * | 6/2010 | Hwang et al. ................ | 313/504 |
| 2005/0221124 A1 * | 10/2005 | Hwang et al. ................ | 428/690 |
| 2008/0248330 A1 | 10/2008 | Joo et al. | |

FOREIGN PATENT DOCUMENTS

| | | |
|---|---|---|
| JP | 11-35532 A | 2/1999 |
| JP | 2005-289914 | 10/2005 |
| KR | 10-2005-0097670 A | 10/2005 |
| KR | 10-2006-0008238 A | 1/2006 |
| KR | 1020080053837 A | 6/2008 |
| KR | 10-2008-0089949 A | 10/2008 |
| WO | WO 2004/029134 A1 | 4/2004 |

OTHER PUBLICATIONS

Derwent abstract for JP 2005-289914 (publication date Oct. 2005).*
Registration Determination Certificate issued by the Korean Intellectual Property Office dated Oct. 31, 2012, 5 pages.
Vinich Promarak, Musubu Ichikawa, Taweesak Sudyoadsuk, Sayant Saengsuwan, Siriporn Jungsuttiwong and Tinnagon Keawin, Synthesis of electrochemically and thermally stable amorphous hole-transporting carbazole dendronized fluorine, Article, (2007), 17-22, Synthetic Metals 157, www.sciencedirect.com.

(Continued)

Primary Examiner — Dawn L. Garrett
(74) Attorney, Agent, or Firm — Knobbe Martens Olson & Bear LLP

(57) ABSTRACT

A dendrimer and an organic light-emitting device including an organic layer having the dendrimer.

21 Claims, 1 Drawing Sheet

(56) References Cited

OTHER PUBLICATIONS

Jonathan P.J. Markham, Ebinazar B. Namdas, Thomas D. Anthopoulos and Iflor D.W. Samuel, Tuning of emission color for blue dendrimer blend light-emitting diodes, Applied Physics Letters, Aug. 30, 2004, 1463-1465, vol. 85, No. 9.

Zhao et al., "Solution-Processable Stiff Dendrimers: Synthesis, Photophysics, Film Morphology, and Electroluminescence", JOA Article, 2009, vol. 74, pp. 383-395.

Chinese Office Action dated Jul. 21, 2014 of corresponding Chinese Patent Application No. 201110221352.6.

* cited by examiner

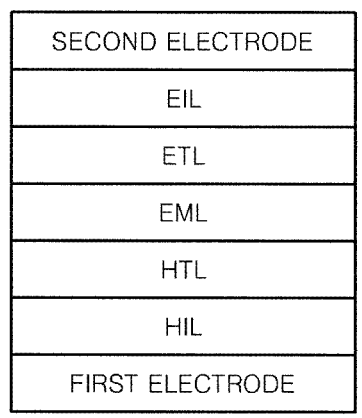

DENDRIMER AND ORGANIC LIGHT-EMITTING DEVICE USING THE SAME

CROSS-REFERENCE TO RELATED APPLICATIONS

This application claims the benefit of Korean Patent Application No. 10-2010-0069169, filed on Jul. 16, 2010, in the Korean Intellectual Property Office, the disclosure of which is incorporated herein in its entirety by reference.

BACKGROUND

1. Field

The present embodiments relate to a dendrimer and an organic light-emitting device including an organic layer having the dendrimer.

2. Description of the Related Technology

A general organic light-emitting device includes an anode, a hole transport layer, an emission layer, an electron transport layer and a cathode, which are sequentially formed on a substrate in the order stated. In this regard, the hole transport layer, the emission layer, and the electron transport layer are organic thin films comprising organic compounds.

An organic light-emitting device is a self-emitting display device in which when a current is applied to a fluorescent or phosphorescent organic layer, electrons are combined with holes in the organic layer, thereby emitting light. Since organic light-emitting devices are lightweight, can be fabricated using simple constituent elements in an easy fabrication process, can realize high image quality, high color purity, and dynamic images, and operate with low power consumption, diverse research is being conducted into organic light-emitting devices. An organic light-emitting device may include a hole-related layer such as a hole injection layer and a hole transport layer and an electron-related layer such as an electron transport layer and an electron injection layer in addition to an organic emission layer between an anode and a cathode.

The material for forming the hole injection layer may be a material that enables to perform a solution process due to a low unit cost. Such a material may include a polymer material, which may be commercially purchased, for example, PEDOT/PSS, which is poly styrene sulfonic acid (PSS) doped poly(ethylenedioxy)thiopene (PEDOT). Also, a low molecular material that is conventionally invented may be used by being dissolved in a general solvent and by performing a solution process such as spin coating.

However, In a PEDOT/PSS composition, PSS is decomposed by reaction with electrons and thus emits a material such as sulfate to diffuse to an adjacent organic layer, for example, an emission layer. Such a diffusion of a material from the hole injection layer to the emission layer causes exciton quenching, thereby deteriorating efficiency and lifespan of organic light-emitting device. Also, when a low molecular material is used in a solution process, recrystallization may occur after spin coating or the material is not uniform.

The present embodiments provide a material for forming a hole injection layer which may be dissolved in an organic solvent so as to perform a solution process and have excellent adhesive strength with ITO and IZO. Also, to the present embodiments increase molecular weight which preventing stacking due to introduction of a bulky functional group.

SUMMARY OF CERTAIN INVENTIVE ASPECTS

The present embodiments provide a dendrimer having excellent electrical stability, high charge transporting capability, and high light-emitting capability.

The present embodiments provide an organic light-emitting device including the dendrimer.

According to an aspect of the present embodiments, there is provided a dendrimer including a core unit, a bridge unit, and a dendrimer unit, wherein the core unit comprises a trivalent or tetravalent functional group selected from the group consisting of a substituted or unsubstituted $C_1$-$C_{50}$ aliphatic hydrocarbon, a substituted or unsubstituted $C_5$-$C_{50}$ aromatic hydrocarbon, and a substituted or unsubstituted $C_3$-$C_{50}$ hetero aromatic hydrocarbon, the bridge unit comprises a divalent or trivalent functional group selected from the group consisting of a substituted or unsubstituted $C_5$-$C_{50}$ aromatic hydrocarbon and a substituted or unsubstituted $C_3$-$C_{50}$ hetero aromatic hydrocarbon, and the dendron unit comprises a monovalent fluorene-based functional group represented by Formula 1 below:

<Formula 1>

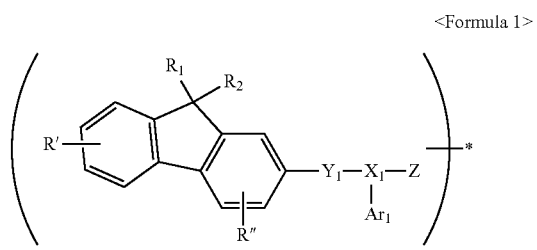

where z is selected from the group consisting of

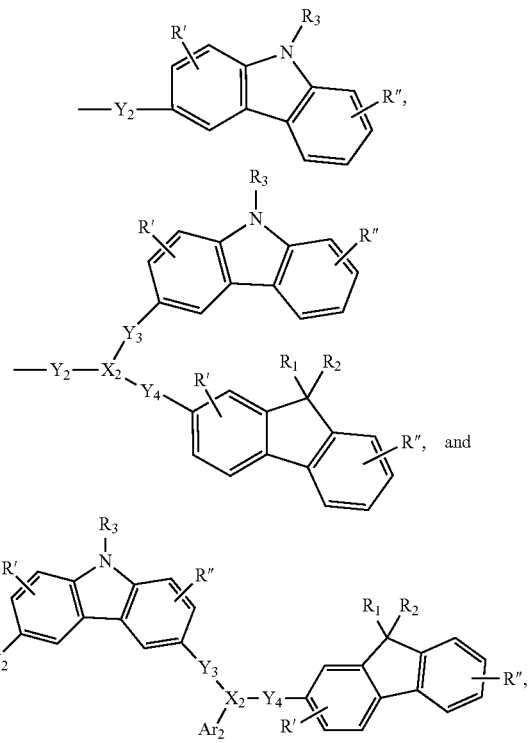

$Ar_1$ and $Ar_2$ are each independently selected from the group consisting of a substituted or unsubstituted $C_5$-$C_{50}$ aryl group and a substituted or unsubstituted $C_3$-$C_{50}$ heteroaryl group, $X_1$ and $X_2$ are each independently selected from the group consisting of nitrogen (N), boron (B), and phosphorus (P), $Y_1, Y_2, Y_3,$ and $Y_4$ are each independently selected from the group consisting of a single bond, a substituted or unsubstituted $C_1$-$C_{50}$ alkylene group, a substituted or unsubstituted $C_2$-$C_{50}$ alkenylene group, a substituted or unsubstituted $C_2$-$C_{50}$ alkynylene group, a substituted or unsubstituted $C_3$-$C_{50}$ cycloalkylene group, a substituted or unsubstituted $C_1$-$C_{50}$ alkoxylene group, a substituted or unsubstituted $C_5$-$C_{50}$ arylene group, and a substituted or unsubstituted $C_3$-$C_{50}$ heteroarylene group, $R_1$, $R_2$, and $R_3$ are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_3$-$C_{50}$ cycloalkyl group, a substituted or unsubstituted $C_1$-$C_{50}$ alkoxy group, a substituted or unsubstituted $C_5$-$C_{50}$ aryl group, and a substituted or unsubstituted $C_3$-$C_{50}$ heteroaryl group, R' and R" are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_5$-$C_{50}$ aryl group, and a substituted or unsubstituted $C_3$-$C_{50}$ heteroaryl group, wherein at least two adjacent groups of $R_1$, $R_2$, $R_3$, R' and R" are linked to form a saturated or unsaturated ring, and

* is a binding site between one selected from the group consisting of $Ar_1$, Z, and a fluorene group, and the bridge unit.

The average molecular weight of the dendrimer may be from about 1,000 to 100,000.

The dendrimer may further include a surface unit that is selected from the group consisting of a substituted or unsubstituted $C_5$-$C_{50}$ aryl group and a substituted or unsubstituted $C_3$-$C_{50}$ heteroaryl group at the end of the dendron unit.

According to another aspect of the present embodiments, there is provided an organic light-emitting device including a pair of electrodes and an organic layer interposed between the electrodes, wherein the organic layer comprises the dendrimer.

BRIEF DESCRIPTION OF THE DRAWINGS

The above and other features and advantages of the present embodiments will become more apparent by describing in detail example embodiments thereof with reference to the attached drawings in which:

FIG. 1 is a diagram of the structure of an organic light-emitting device according to an embodiment.

DETAILED DESCRIPTION OF CERTAIN INVENTIVE EMBODIMENTS

A dendrimer according to an embodiment includes a core unit, a bridge unit, and a dendron unit, wherein the core unit includes a trivalent or tetravalent functional group selected from the group consisting of a substituted or unsubstituted $C_1$-$C_{50}$ aliphatic hydrocarbon, a substituted or unsubstituted $C_5$-$C_{50}$ aromatic hydrocarbon, and a substituted or unsubstituted $C_3$-$C_{50}$ hetero aromatic hydrocarbon, the bridge unit includes a divalent or trivalent functional group selected from the group consisting of a substituted or unsubstituted $C_5$-$C_{50}$ aromatic hydrocarbon and a substituted or unsubstituted $C_3$-$C_{50}$ hetero aromatic hydrocarbon, and the dendron unit includes a monovalent fluorene-based functional group represented by Formula 1 below:

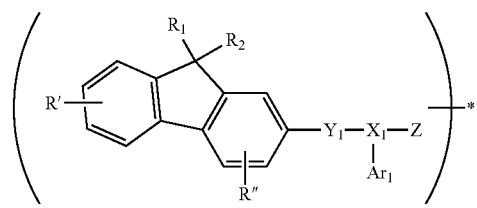
<Formula 1>

In Formula 1, Z is selected from the group consisting of

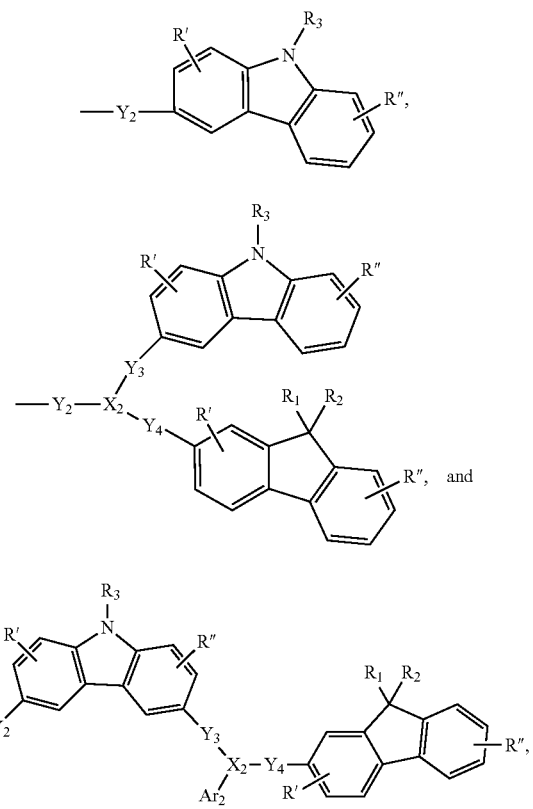

wherein Z may be in a divalent oxidation state when it is linked to the bridge unit. Hereinafter, it is assumed that Z is in a divalent oxidation state when it is linked to the bridge unit.

Dendrimer is a tree-like highly branched polymer molecule comprising a branch-like unit repeatedly extending from a core unit. The dendrimer includes a core unit positioned at the center of the spherical structure, a bridge unit regularly and repeatedly extending from the core unit, and a dendron unit connected to the bridge unit and positioned at the opposite side of the core unit.

In the dendrimer, the core unit that is in a trivalent or tetravalent oxidation state is positioned at the center of the spherical structure, generation is increased when the bridge unit is linked to the core unit, and the dendron unit is positioned at the end of the bridge unit.

The dendron unit may include a monovalent fluorene-based functional group represented by Formula 1.

In Formula 1, $Ar_1$ and $Ar_2$ are each independently selected from the group consisting of a substituted or unsubstituted $C_5$-$C_{50}$ aryl group and a substituted or unsubstituted $C_3$-$C_{50}$ heteroaryl group. In this regard, if $Ar_1$ is linked to the bridge unit, $Ar_1$ is in a divalent oxidation state and may be selected from the group consisting of a $C_5$-$C_{50}$ arylene group and a substituted or unsubstituted $C_3$-$C_{50}$ heteroarylene group. Hereinafter, it is assumed that $Ar_1$ is in a divalent oxidation state when it is linked to the bridge unit.

$Ar_1$ and $Ar_2$ are each independently selected from the group consisting of a phenyl group, a halophenyl group, a cyanophenyl group, a phenoxyphenyl group, a $C_1$-$C_{15}$ alkyl phenyl group, a di($C_1$-$C_{15}$ alkyl) phenyl group, a $C_1$-$C_{15}$ alkoxy phenyl group, a di($C_1$-$C_{15}$ alkoxy) phenyl group, a $C_5$-$C_{15}$ aryl phenyl group, a di($C_5$-$C_{15}$ aryl) phenyl group, a naphthyl group, a halonaphthyl group, a cyanonaphthyl group, a phenoxynaphthyl group, a $C_1$-$C_{15}$ alkyl naphthyl group, a di($C_1$-$C_{15}$ alkyl) naphthyl group, a $C_1$-$C_{15}$ alkoxy naphthyl group, a di($C_5$-$C_{15}$ alkoxy) naphthyl group, a $C_5$-$C_{15}$ aryl naphthyl group, a di($C_5$-$C_{15}$ aryl) naphthyl group, an anthryl group, a halo-anthryl group, a cyanoanthryl group, a phenoxyanthryl group, a $C_1$-$C_{15}$ alkyl anthryl group, a di($C_1$-$C_{15}$ alkyl) anthryl group, a $C_1$-$C_{15}$ alkoxy anthryl group, a di($C_1$-$C_{15}$ alkoxy) anthryl group, a $C_5$-$C_{15}$ aryl anthryl group, a di($C_5$-$C_{15}$ aryl) anthryl group, a phenanthryl group, a halophenanthryl group, a cyanophenanthryl group, a phenoxyphenanthryl group, a $C_1$-$C_{15}$ alkyl phenanthryl group, a di($C_1$-$C_{15}$ alkyl) phenanthryl group, a $C_1$-$C_{15}$ alkoxy phenanthryl group, a di($C_1$-$C_{15}$ alkoxy) phenanthryl group, a $C_5$-$C_{15}$ aryl phenanthryl group, a di($C_5$-$C_{15}$ aryl) phenanthryl group, a fluorenyl group, a halofluorenyl group, a cyanofluorenyl group, a phenoxyfluorenyl group, a $C_1$-$C_{15}$ alkyl fluorenyl group, a di($C_1$-$C_{15}$ alkyl) fluorenyl group, a $C_1$-$C_{15}$ alkoxy fluorenyl group, a di($C_1$-$C_{15}$ alkoxy) fluorenyl group, a $C_5$-$C_{15}$ aryl fluorenyl group, a di($C_5$-$C_{15}$ aryl) fluorenyl group, a pyridyl group, a halopyridyl group, a cyanopyridyl group, a phenoxypyridyl group, a $C_1$-$C_{15}$ alkyl pyridyl group, a di($C_1$-$C_{15}$ alkyl) pyridyl group, a $C_1$-$C_{15}$ alkoxy pyridyl group, a di($C_1$-$C_{15}$ alkoxy) pyridyl group, a $C_5$-$C_{15}$ aryl pyridyl group, a di($C_5$-$C_{15}$ aryl) pyridyl group, a pyrenyl group, a halopyrenyl group, a cyanopyrenyl group, a phenoxypyrenyl group, a $C_1$-$C_{15}$ alkyl pyrenyl group, a di($C_1$-$C_{15}$ alkyl) pyrenyl group, a $C_1$-$C_{15}$ alkoxy pyrenyl group, a di($C_1$-$C_{15}$ alkoxy) pyrenyl group, a $C_5$-$C_{15}$ aryl pyrenyl group, a di($C_5$-$C_{15}$ aryl) pyrenyl group, a phenanthrolinyl group, a halophenanthrolinyl group, a cyanophenanthrolinyl group, a phenoxyphenanthrolinyl group, a $C_1$-$C_{15}$ alkyl phenanthrolinyl group, a di($C_1$-$C_{15}$ alkyl) phenanthrolinyl group, a $C_1$-$C_{15}$ alkoxy phenanthrolinyl group, a di($C_1$-$C_{15}$ alkoxy) phenanthrolinyl group, a $C_5$-$C_{15}$ aryl phenanthrolinyl group, a di($C_5$-$C_{15}$ aryl) phenanthrolinyl group, a quinolinyl group, a haloquinolinyl group, a cyanoquinolinyl group, a phenoxyquinolinyl group, a $C_1$-$C_{15}$ alkyl quinolinyl group, a di($C_1$-$C_{15}$ alkyl) quinolinyl group, a $C_1$-$C_{15}$ alkoxy quinolinyl group, a di($C_1$-$C_{15}$ alkoxy) quinolinyl group, a $C_5$-$C_{15}$ aryl quinolinyl group, a di($C_5$-$C_{15}$ aryl) quinolinyl group, a carbazolyl group, a halocarbazolyl group, a cyanocarbazolyl group, a phenoxycarbazolyl group, a $C_1$-$C_{15}$ alkyl carbazolyl group, a di($C_1$-$C_{15}$ alkyl) carbazolyl group, a $C_1$-$C_{15}$ alkoxy carbazolyl group, a di($C_1$-$C_{15}$ alkoxy) carbazolyl group, a $C_5$-$C_{15}$ aryl carbazolyl group, and a di($C_5$-$C_{15}$ aryl) carbazolyl group.

In some embodiments, $Ar_1$ and $Ar_2$ may each independently be a phenyl group, a halophenyl group, a cyanophenyl group, a biphenyl group, a dimethylfluorenyl group, a carbazolyl group, of a diphenylcarbazolyl group.

In Formula 1, $X_1$ and $X_2$ may be each independently selected from the group consisting of nitrogen (N), boron (B) and phosphorus (P). In some embodiments, both of $X_1$ and $X_2$ may be nitrogen (N).

In Formula 1, $Y_1$ to $Y_4$ may be each independently selected from the group consisting of a single bond, a substituted or unsubstituted $C_1$-$C_{50}$ alkylene group, a substituted or unsubstituted $C_2$-$C_{50}$ alkenylene group, a substituted or unsubstituted $C_2$-$C_{50}$ alkynylene group, a substituted or unsubstituted $C_3$-$C_{50}$ cycloalkylene group, a substituted or unsubstituted $C_1$-$C_{50}$ alkoxylene group, a substituted or unsubstituted $C_5$-$C_{50}$ arylene group, and a substituted or unsubstituted $C_3$-$C_{50}$ heteroarylene group.

In some embodiments, $Y_1$ to $Y_4$ may each independently be selected from the group consisting of a single bond, a methyl group, an ethyl group, a propyl group, an isobutyl group, a sec-butyl group, a phenyl group, a methylphenyl group, an ethylphenyl group, an o-fluorophenyl group, an m-fluorophenyl group, a p-fluorophenyl group, a dichlorophenyl group, a cyanophenyl group, a dicyanophenyl group, a trifluoromethoxyphenyl group, a biphenyl group, a halobiphenyl group, a cyanobiphenyl group, a methylbiphenyl group, an ethylbiphenyl group, a methoxybiphenyl group, and an ethoxybiphenyl group.

In some other embodiments, $Y_1$ to $Y_4$ may be each independently a single bond, a methyl group, an ethyl group, a propyl group, an isobutyl group, a sec-butyl group, a phenyl group, or a diphenyl group.

In Formula 1, $R_1$ to $R_5$ may be each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_3$-$C_{50}$ cycloalkyl group, a substituted or unsubstituted $C_1$-$C_{50}$ alkoxy group, a substituted or unsubstituted $C_5$-$C_{50}$ aryl group, and a substituted or unsubstituted $C_3$-$C_{50}$ heteroaryl group, and R' and R" may be each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_5$-$C_{50}$ aryl group, and a substituted or unsubstituted $C_3$-$C_{50}$ heteroaryl group, wherein at least two adjacent groups of $R_1$, $R_2$, $R_3$, R' and R" are linked to form a saturated or unsaturated ring.

$R_1$, $R_2$, $R_3$, R' and R" may each independently be selected from the group consisting of a hydrogen atom, a heavy hydrogen atom, deuterium, tritium, a halogen atom, a cyano group, an amino group, a methyl group, an ethyl group, a propyl group, an isobutyl group, a sec-butyl group, a phenyl group, a methylphenyl group, an ethylphenyl group, an o-fluorophenyl, a m-fluorophenyl and a p-fluorophenyl group, a dichlorophenyl group, a cyanophenyl group, a dicyanophenyl group, a trifluoromethoxyphenyl group, a biphenyl group, a halobiphenyl group, a cyanobiphenyl group, a methylbiphenyl group, an ethylbiphenyl group, a methoxybiphenyl group, and an ethoxybiphenyl group.

For example, $R_1$, $R_2$, $R_3$, R' and R" may be each independently a hydrogen atom, a heavy hydrogen atom, deuterium, tritium, a halogen atom, a cyano group, an amino group, a methyl group, an ethyl group, a propyl group, an isobutyl group, a sec-butyl group, a phenyl group, or a biphenyl group.

In Formula 1, * is a binding site between one selected from the group consisting of $Ar_1$, Z, and a fluorene group, and the bridge unit. For example, * may be a binding site between $Ar_1$ of Formula 1 and the bridge unit, between Z and the bridge unit, or between a fluorene group and the bridge unit.

The monovalent fluorene-based functional group represented by Formula 1 may have at least one fluorene group and one carbazol group and may be used for an organic layer of an organic light-emitting device.

The carbazol group has a rigid structure so that a glass transition temperature and a melting point are high. Accordingly, when a compound including the carbazol group is used for an organic layer of an organic light-emitting device, thermal resistance and tolerance under high temperature against Joule's heat generated in the organic layer, between the organic layer, and/or between the organic layer and a metal electrode while emitting may be increased. When such a compound is used for a hole transport layer of an organic light-emitting device, an emitting material, or a host material of an emission layer, the compound has excellent luminance and long life-span. In particular, compounds having two or more carbazol groups therein have increased rigidity and thus are more efficient. Also, the carbazol group improves energy transfer from a singlet exciton state to a triplet exciton state. Accordingly, when the compound is used as a green or red phosphorescent host, energy transfer from the host to a phosphorescent dopant is smoothly accomplished, thereby obtaining an organic light-emitting device having excellent luminance and high efficient.

The fluorene group facilitates transfer of singlet excitons. Thus, if a compound including the fluorene group is used in an emission layer of an organic light-emitting device, the intensity of fluorescence increases to improve luminance. If the compound including the fluorene group is used as a host material of a fluorescent or phosphorescent dopant, energy transfer to a dopant increases to improve luminance For example, the dendron unit may include one selected from the group consisting of the functional groups represented by Formulae 2 to 6.

<Formula 2>

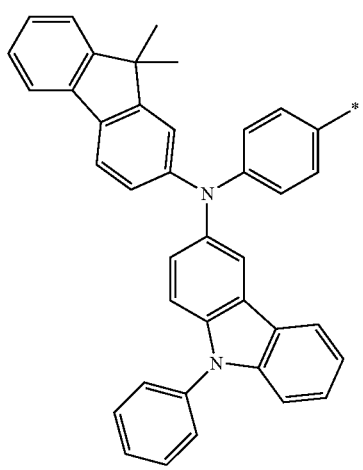

<Formula 3>

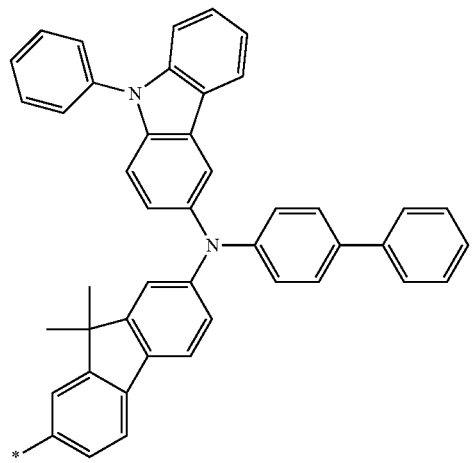

<Formula 4>

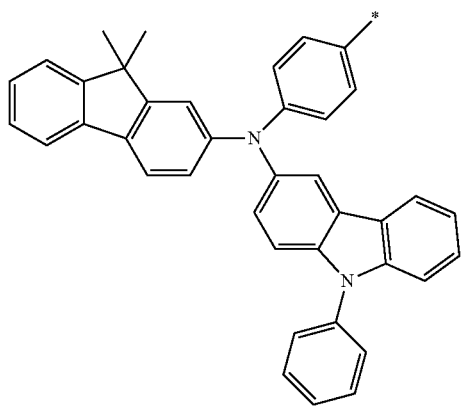

<Formula 5>

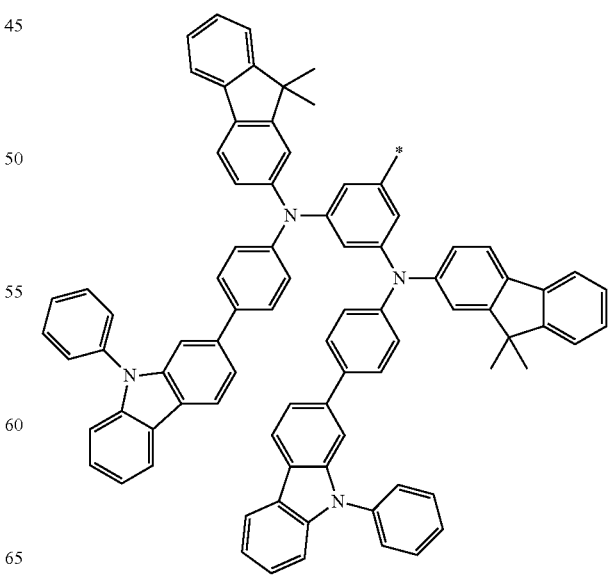

<Formula 6>

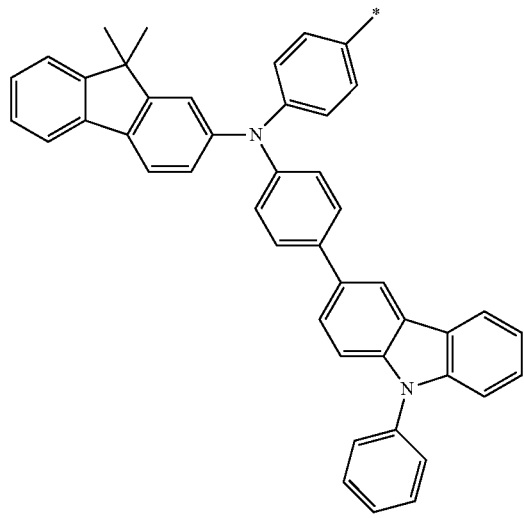

In Formulae 2 to 6, * is a binding site with the bridge unit.

In the dendrimer, the bridge unit is linked to the dendron unit via the binding site to increase generation.

The bridge unit is in a divalent or trivalent oxidation state and may be linked to an adjacent core unit or dendron unit via the binding site. If a plurality of bridge units are consecutively connected, the bridge unit may be linked to another bridge unit.

The bridge unit may be any divalent or trivalent linking group capable of linking adjacent units without inducing side reactions during the reaction with the dendron unit including the fluorene-based functional group. The bridge unit may include O and S to improve stability of a final product.

The bridge unit may include a divalent or trivalent functional group selected from the group consisting of a substituted or unsubstituted $C_5$-$C_{50}$ aromatic hydrocarbon and a substituted or unsubstituted $C_3$-$C_{50}$ hetero aromatic hydrocarbon.

For example, the bridge unit may include one selected from the group consisting of the functional groups represented by Formulae 7 to 10.

<Formula 7>

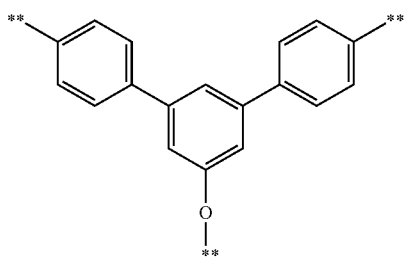

<Formula 8>

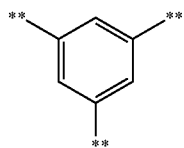

<Formula 9>

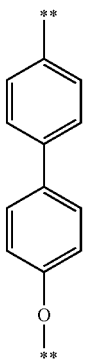

<Formula 10>

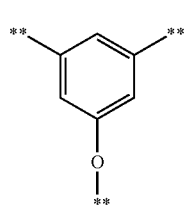

In Formulae 7 to 10,  is a binding site with an adjacent unit.  may be a binding site with the core unit, the dendron unit, or the bridge unit. If ** is a binding site with the bridge unit, the bridge units are consecutively linked to each other.

The dendrimer according to an embodiment includes the core unit at the center of the entire spherical structure to be connected to the bridge unit.

The core unit may be in the trivalent or tetravalent oxidation state and linked to the bridge unit via the binding site.

The core unit may include a trivalent or tetravalent functional group selected from the group consisting of a substituted or unsubstituted $C_1$-$C_{50}$ aliphatic hydrocarbon, a substituted or unsubstituted $C_5$-$C_{50}$ aromatic hydrocarbon, and a substituted or unsubstituted $C_3$-$C_{50}$ hetero aromatic hydrocarbon.

For example, the core unit may include one selected from the group consisting of the functional groups represented by Formulae 11 to 15.

<Formula 11>

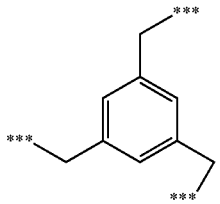

<Formula 12>

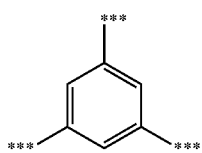

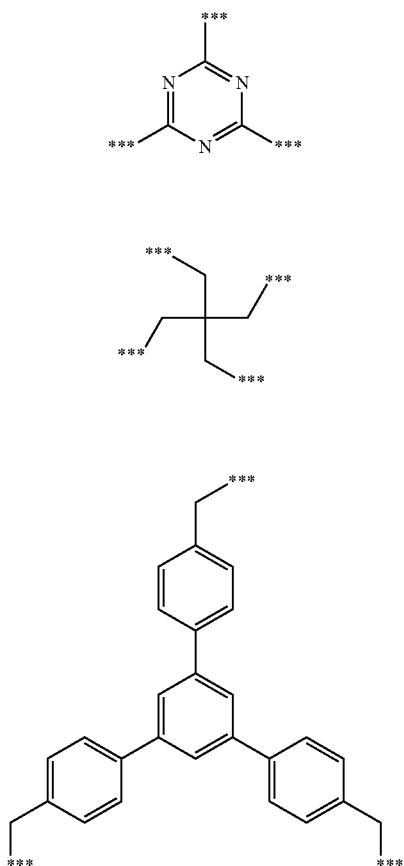

<Formula 13>

<Formula 14>

<Formula 15>

In Formulae 11 to 15, *** is a binding site with the bridge unit.

The average molecular weight of the dendrimer including the core unit, the bridge unit, and the dendron unit may be from about 1,000 to 100,000.

The degree of branching of the dendrimer refers to a rate of a total number of the core unit and the dendrimer to a total number of the core unit, the bridge unit, and the dendron unit. For example, if the degree of branching is 0, the dendrimer is a linear molecule only having the bridge unit without the core unit and the dendron unit. If the degree of branching is 1, the bridge unit does not exist, and thus the dendron unit does not exist, either. The degree of branching may be calculated based on a ratio of integral values for the peaks of the nuclear magnetic resonance (NMR) spectra of the core unit, the bridge unit, and the dendron unit. The degree of branching of the dendrimer may vary according to reaction temperature, reaction time, solvent, and the like and may be about 0.05 to about 0.8.

The dendrimer may further include a surface unit that is selected from the group consisting of a substituted or unsubstituted $C_5$-$C_{50}$ aryl group and a substituted or unsubstituted $C_3$-$C_{50}$ heteroaryl group at the end of the dendron unit.

For example, the dendrimer may further include a surface unit connected to a fluorene-based functional group represented by Formula 16 below:

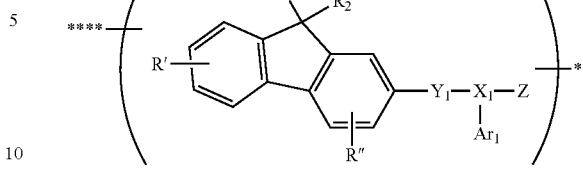

In Formula 16, Z is selected from the group consisting of

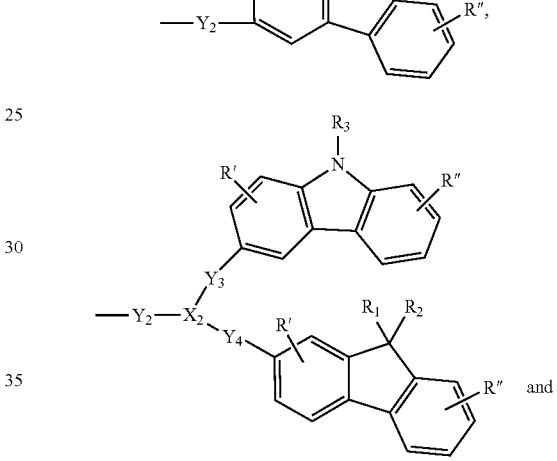

and $Ar_1$, $Ar_2$, $X_1$, $X_2$, $Y_1$, $Y_2$, $Y_3$, $Y_4$, $R_1$, $R_2$, $R_3$, R', and R" are described above with reference to Formula 1. In this regard, one of * and **** is a binding site with the bridge unit and the other is a binding site with the surface unit.

The surface unit that is a unit independently connected to the dendron unit and positioned at the end (surface) of the dendron unit may be selected from the group consisting of a substituted or unsubstituted $C_5$-$C_{50}$ aryl group and a substituted or unsubstituted $C_3$-$C_{50}$ heteroaryl group.

For example, the surface unit may be a phenyl group, a halophenylene group, a cyanophenylene group, a biphenyl group, a dimethylfluorenyl group, a carbazolyl group, or a diphenylcarbazolyl group.

The dendrimer including the core unit, the bridge unit, and the dendron unit including a functional group represented by Formula 1 may be Dendrimers 1 to 6. However, the dendrimer is not limited to the following formulae.

<Dendrimer 1>
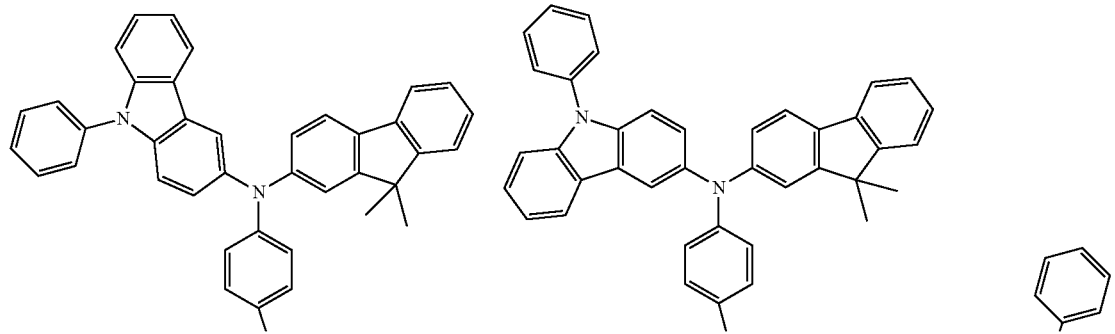
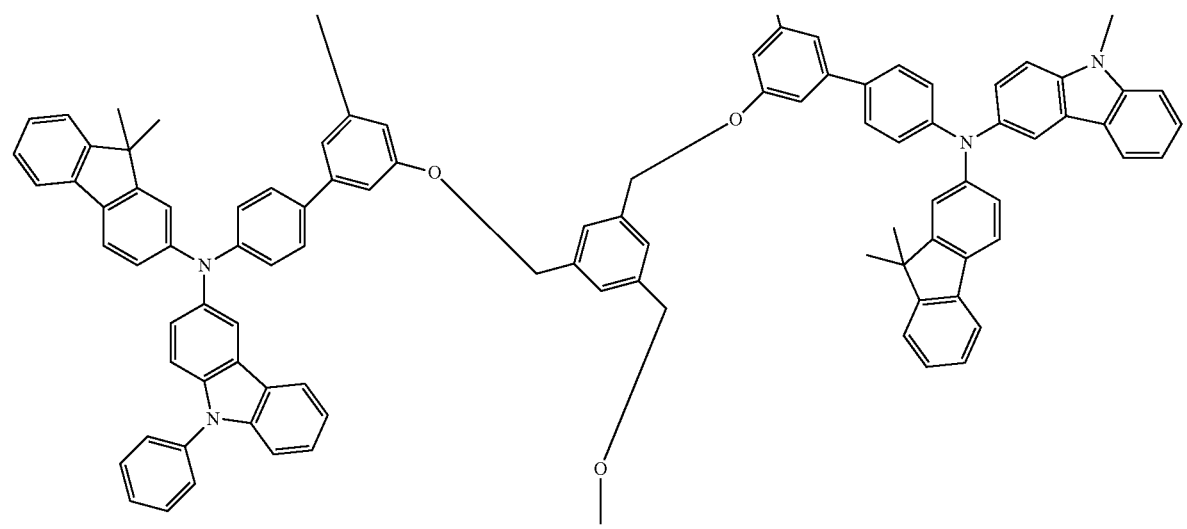
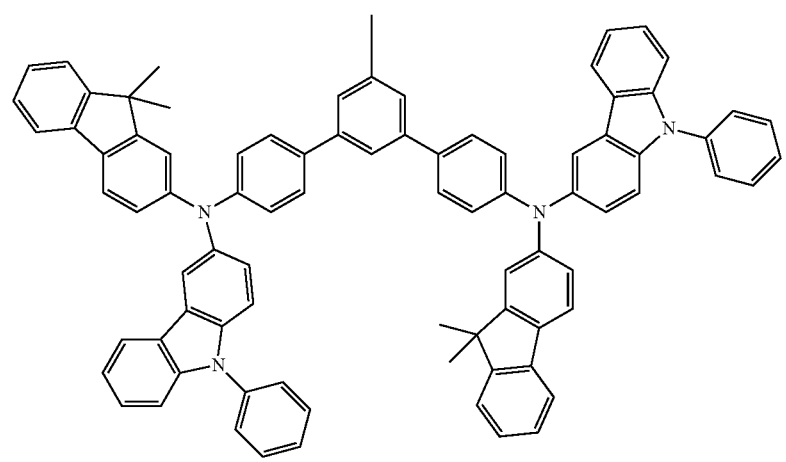

-continued
<Dendrimer 2>
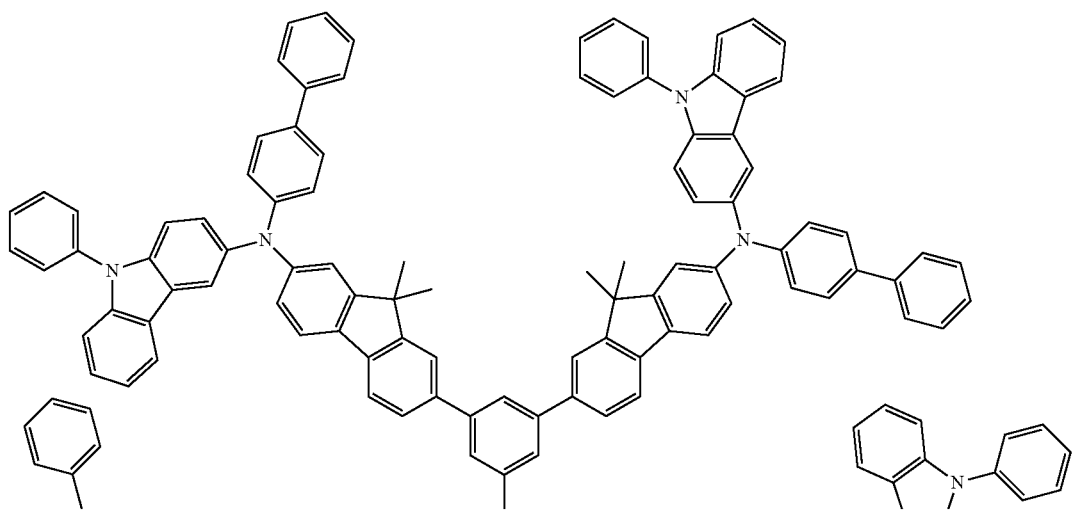
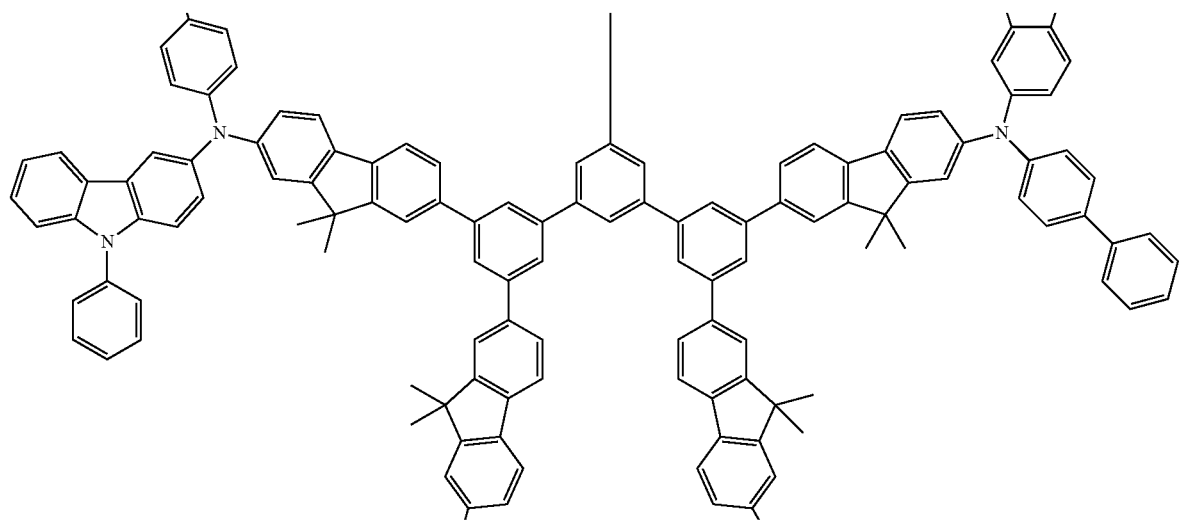
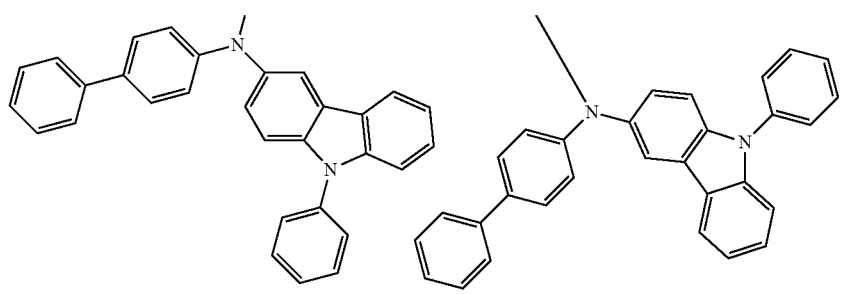

<Dendrimer 3>
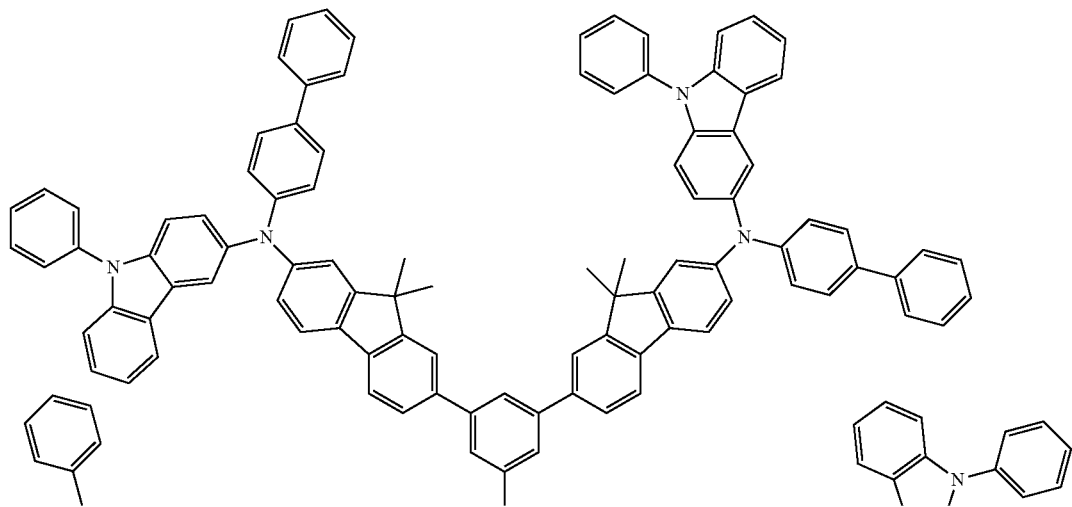
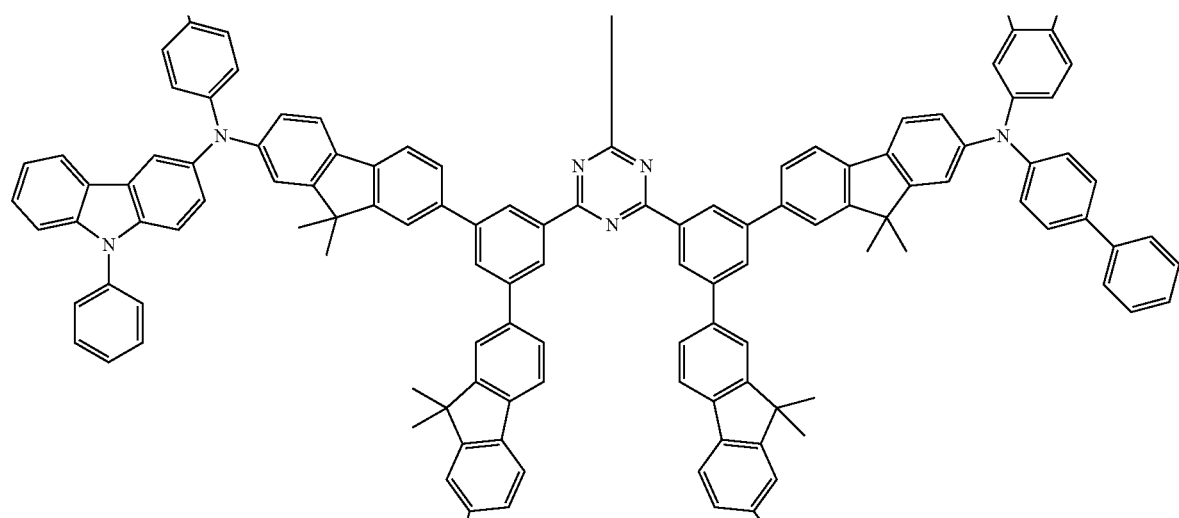
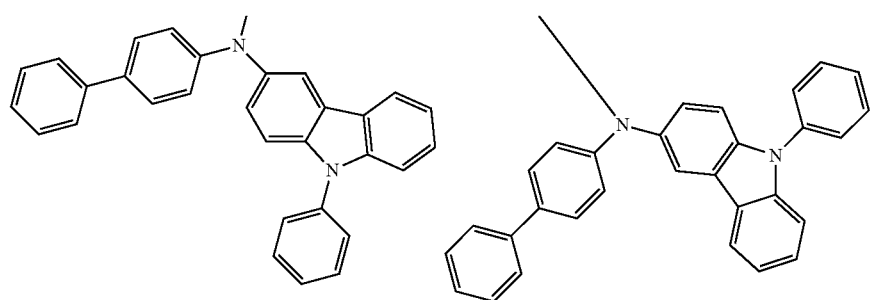

-continued
<Dendrimer 4>
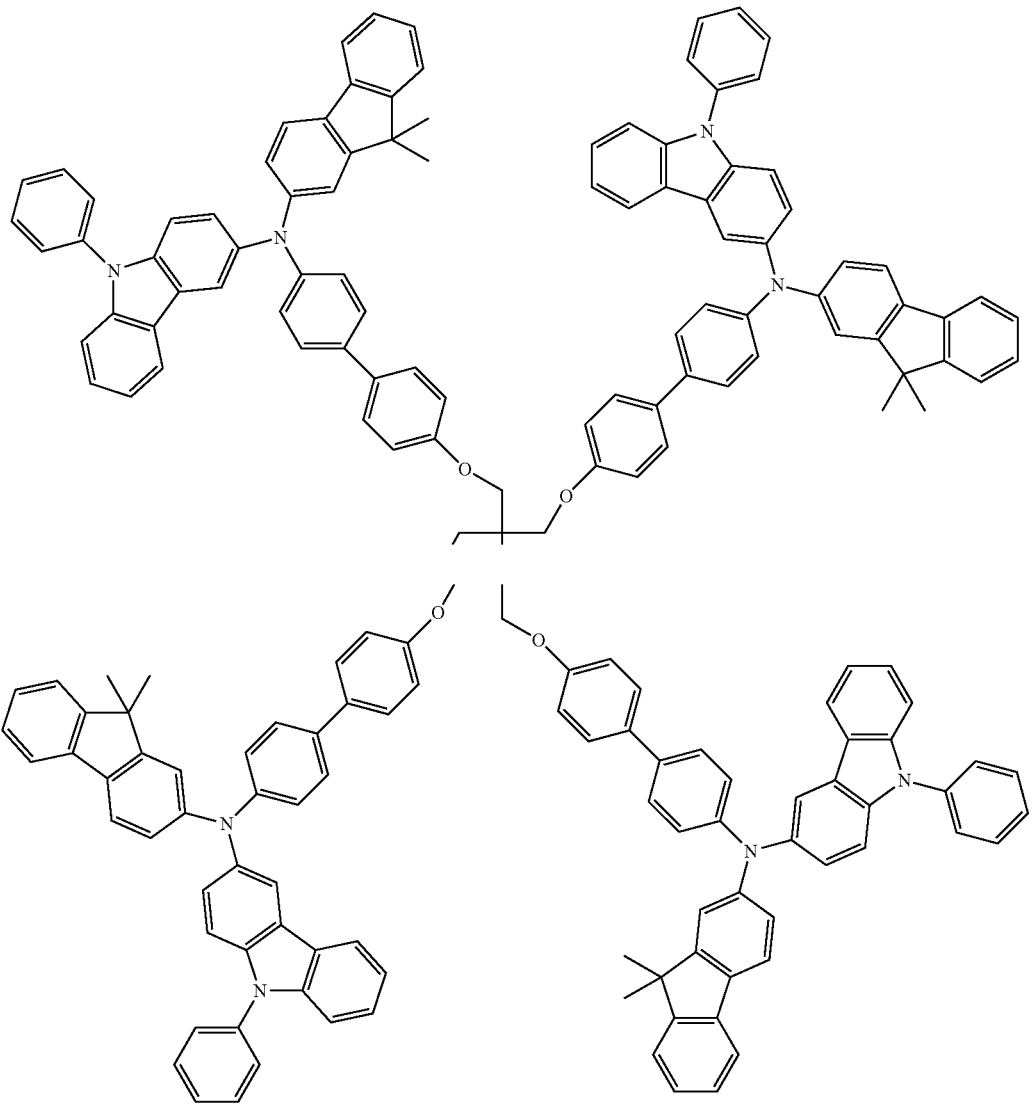
<Dendrimer 5>
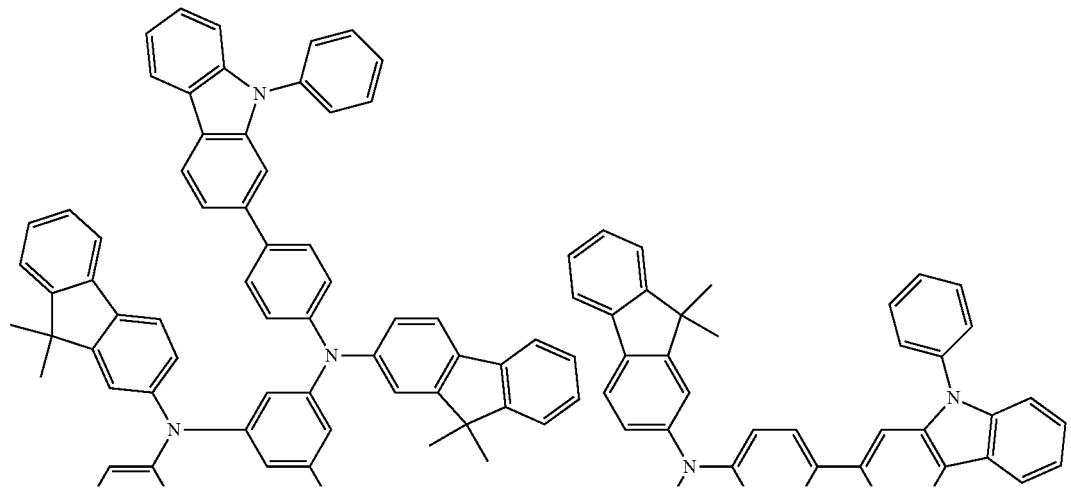

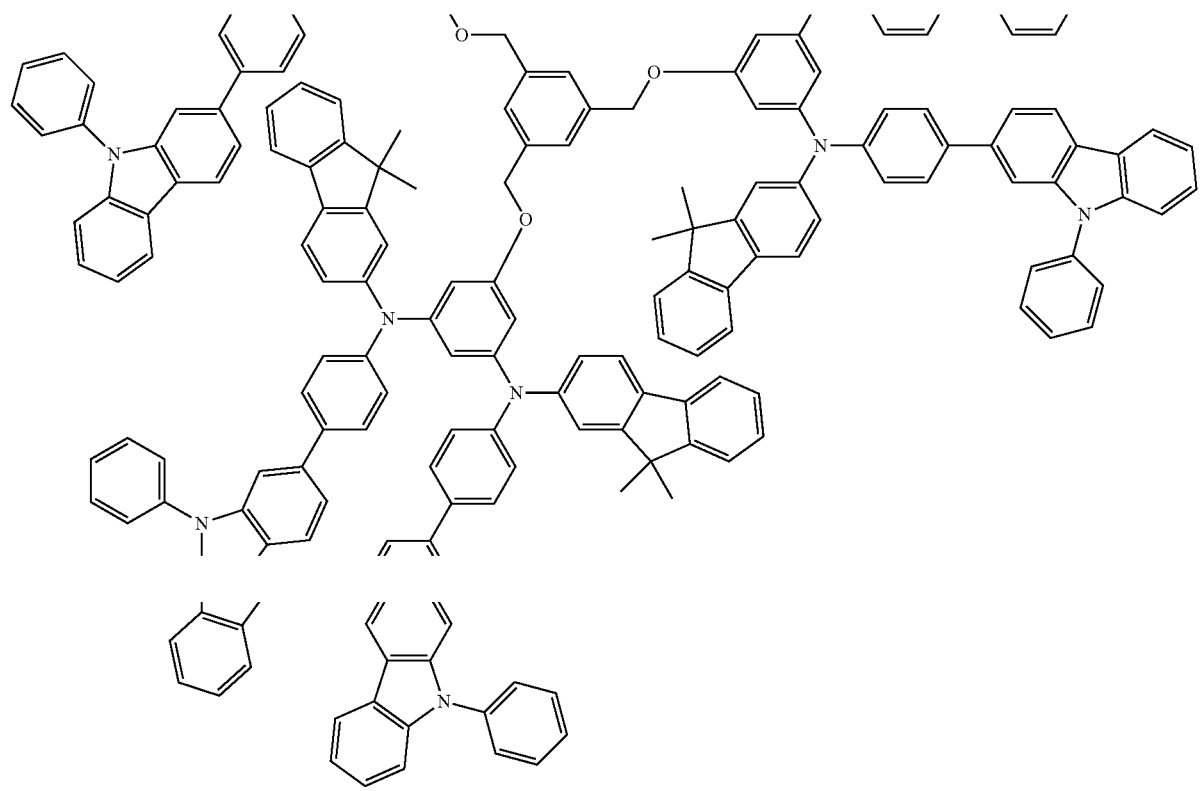
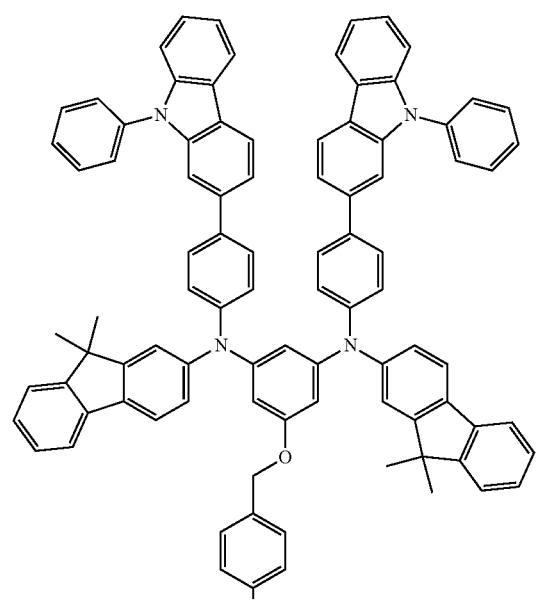
<Dendrimer 6>

-continued

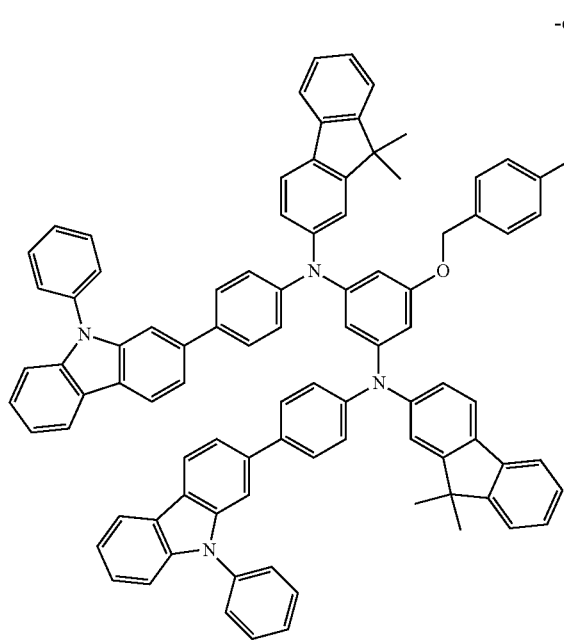 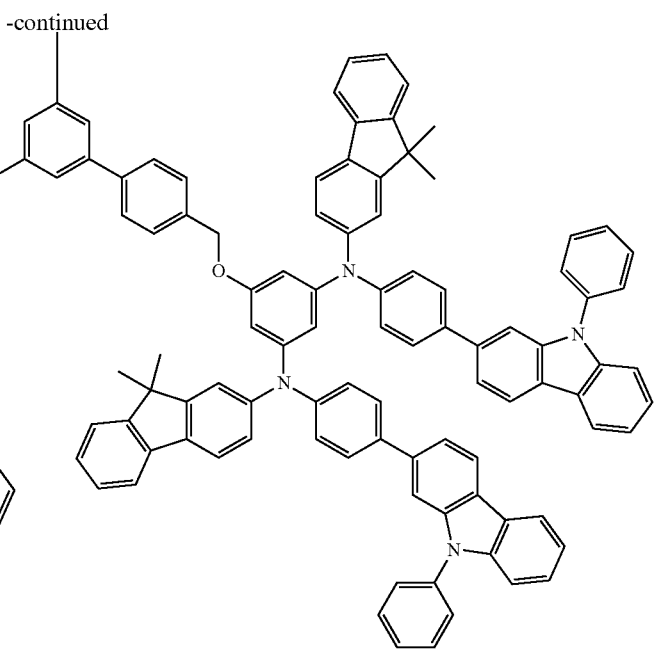

The unsubstituted $C_1$-$C_{50}$ alkyl group used herein may be a linear or branched group. Examples of the unsubstituted $C_1$-$C_{50}$ alkyl group include, but are not limited to, methyl, ethyl, propyl, isobutyl, sec-butyl, pentyl, iso-amyl, hexyl, heptyl, octyl, nonanyl, and dodecyl. At least one hydrogen atom of the $C_1$-$C_{50}$ alkyl group may be substituted with a heavy hydrogen atom, deuterium, tritium, a halogen atom, a cyano group, an amino group, an amidino group, a nitro group, a hydroxyl group, a hydrazinyl group, a hydrazonyl group, a carboxyl group or a salt thereof, a sulfonic acid group or a salt thereof, a phosphoric acid or a salt thereof, a $C_1$-$C_{30}$ alkyl group, a $C_1$-$C_{30}$ alkoxy group, a $C_2$-$C_{30}$ alkenyl group, a $C_2$-$C_{30}$ alkynyl group, a $C_5$-$C_{20}$ aryl group, a $C_3$-$C_{20}$ heteroaryl group, —N($Q_1$)($Q_2$), or —Si($Q_3$)($Q_4$)($Q_5$). Here, $Q_1$ through $Q_5$ may be each independently a hydrogen atom, a heavy hydrogen atom, deuterium, tritium, a halogen atom, a cyano group, an amino group, an amidino group, a nitro group, a hydroxyl group, a hydrazinyl group, a hydrazonyl group, a carboxyl group or a salt thereof, a sulfonic acid group or a salt thereof, a phosphoric acid or a salt thereof, a $C_1$-$C_{30}$ alkyl group, a $C_1$-$C_{30}$ alkoxy group, a $C_2$-$C_{30}$ alkenyl group, a $C_2$-$C_{30}$ alkynyl group, a $C_5$-$C_{20}$ aryl group, or a $C_3$-$C_{20}$ heteroaryl group.

The unsubstituted $C_2$-$C_{50}$ alkenyl group used herein indicates a hydrocarbon chain having at least one carbon-carbon double bond at the center or at a terminal of the unsubstituted $C_2$-$C_{50}$ alkyl group. Examples of the unsubstituted $C_2$-$C_{50}$ alkenyl group include ethenyl, propenyl, butenyl, and the like. At least one hydrogen atom in the unsubstituted $C_2$-$C_{50}$ alkenyl group may be substituted with the substituents described in connection with the substituted $C_1$-$C_{50}$ alkyl group.

The unsubstituted $C_2$-$C_{50}$ alkynyl group used herein indicates a hydrocarbon chain having at least one carbon-carbon triple bond at the center or at a terminal of the $C_2$-$C_{50}$ alkyl group defined above. Examples of the unsubstituted $C_2$-$C_{20}$ alkynyl group include acetylene, propylene, phenylacetylene, naphthylacetylene, isopropylacetylene, t-butylacetylene, and diphenylacetylene. At least one hydrogen atom in the unsubstituted $C_2$-$C_{20}$ alkynyl group may be substituted with the substituents described above in connection with the $C_1$-$C_{50}$ alkyl group.

The unsubstituted $C_3$-$C_{50}$ cycloalkyl group used herein refers to a $C_3$-$C_{50}$ cyclic alkyl group wherein at least one hydrogen atom in the $C_3$-$C_{50}$ cycloalkyl group may be substituted with substituents described above in connection with the $C_1$-$C_{50}$ alkyl group.

The unsubstituted $C_1$-$C_{50}$ alkoxy group used herein is a group having a structure of —OA wherein A is an unsubstituted $C_1$-$C_{50}$ alkyl group as described above. Examples thereof include methoxy, ethoxy, propoxy, isopropyloxy, butoxy, and pentoxy. At least one hydrogen atom of the $C_1$-$C_{50}$ alkoxy group may be substituted with the same substituent groups as described above in connection with the $C_1$-$C_{50}$ alkyl group.

The unsubstituted $C_5$-$C_{50}$ aryl group used herein refers to a carbocyclic aromatic system containing at least one ring. At least two rings may be fused to each other or linked to each other by a single bond. The term 'aryl' refers to an aromatic system, such as phenyl, naphthyl, or anthracenyl. At least one hydrogen atom in the $C_5$-$C_{50}$ aryl group may be substituted with the substituents described above in connection with the $C_1$-$C_{50}$ alkyl group. Examples of the substituted or unsubstituted $C_5$-$C_{30}$ aryl group include, but are not limited to, a phenyl group, a $C_1$-$C_{10}$ alkylphenyl group (for example, an ethyl phenyl group), a halophenyl group (for example, an o-fluorophenyl, an m-fluorophenyl, a p-fluorophenyl group, a dichlorophenyl group), a cyanophenyl group, dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, a o-, m-, and p-toryl group, an o-, m-, and p-cumenyl group, a mesityl group, a phenoxyphenyl group, a (αα-dimethylbenzene)phenyl group, an (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted $C_3$-$C_{50}$ heteroaryl group used herein includes one, two or three hetero atoms selected from among N, O, P, and S. At least two rings may be fused to each other or linked to each other by a single bond. Examples of the unsubstituted $C_3$-$C_{50}$ heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, and an isoquinolinyl group. At least one hydrogen atom in the $C_3$-$C_{50}$ heteroaryl group may be substituted with the substituents described above in connection with the $C_1$-$C_{50}$ alkyl group.

The unsubstituted $C_1$-$C_{50}$ aliphatic hydrocarbon functional group may be a linear or branched $C_1$-$C_{50}$ alkyl group. Examples of the unsubstituted $C_1$-$C_{50}$ aliphatic hydrocarbon include, but are not limited to, methyl, ethyl, n-propyl, i-propyl, n-butyl, s-butyl, i-butyl, t-butyl, pentyl, hexyl, heptyl, octyl, nonanyl, and dodecyl. At least one hydrogen atom of the $C_1$-$C_{50}$ aliphatic hydrocarbon functional group may be substituted with a heavy hydrogen atom, deuterium, tritium, a halogen atom, a cyano group, an amino group, an amidino group, a nitro group, a hydroxyl group, a hydrazinyl group, a hydrazonyl group, a carboxyl group or a salt thereof, a sulfonic acid group or a salt thereof, a phosphoric acid or a salt thereof, a $C_1$-$C_{30}$ alkyl group, a $C_1$-$C_{30}$ alkoxy group, a $C_2$-$C_{30}$ alkenyl group, and a $C_2$-$C_{30}$ alkynyl group.

The unsubstituted $C_5$-$C_{50}$ aromatic hydrocarbon functional group used herein is the same as the $C_5$-$C_{50}$ aryl group and may be substituted with the substituents described above in connection with the $C_1$-$C_{50}$ alkyl group.

The unsubstituted $C_3$-$C_{50}$ hetero aromatic hydrocarbon functional group used herein is the same as the $C_3$-$C_{50}$ heteroaryl group and may be substituted with the substituents described above in connection with the $C_1$-$C_{50}$ alkyl group.

Throughout the specification, a saturated ring or unsaturated ring formed by the linking of at least two adjacent substituents indicates a substituent including at least two rings formed by the fusing of at least one aromatic ring and/or at least one non-aromatic ring. Examples of this substituent include some of the substituents described above in connection with the aryl group or heteroaryl group.

An organic light-emitting device according to another embodiment includes a first electrode; a second electrode disposed opposite to the first electrode; and an organic layer between the first electrode and the second electrode, wherein the organic layer includes a dendrimer including a dendron unit represented by Formula 1 described above.

Hereinafter, a method of preparing the dendrimer according to an embodiment will be described. For example, a method of preparing the dendrimer represented by Formula 16 is described.

Synthesis of Compound 5 (dendron unit)

[Equation 1]

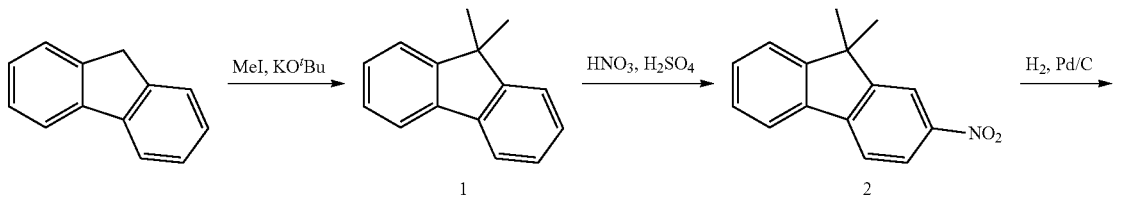

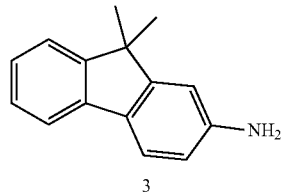

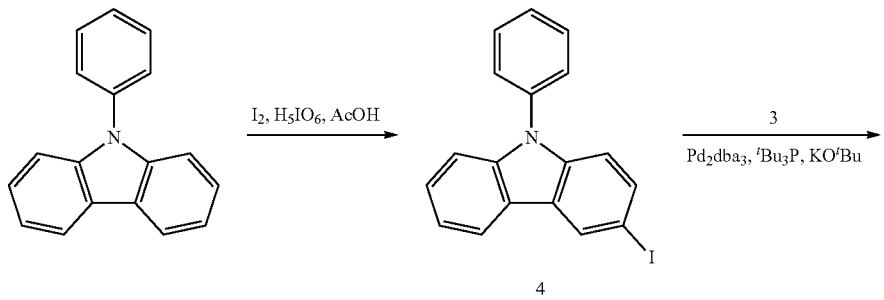

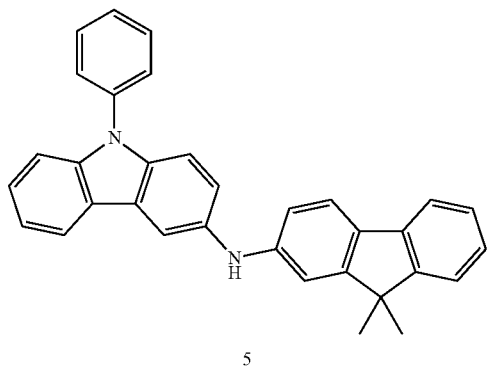
Synthesis of Compound 12 (bridge unit)
[Equation 2]
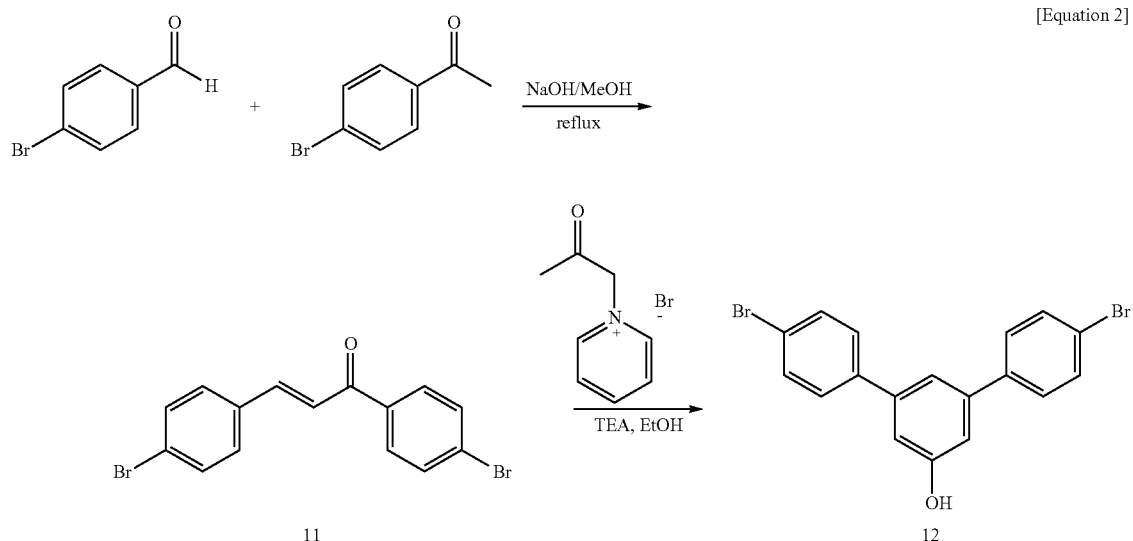
Synthesis of Compounds 16 and 17 (combination of dendron unit and bridge unit)
[Equation 3]
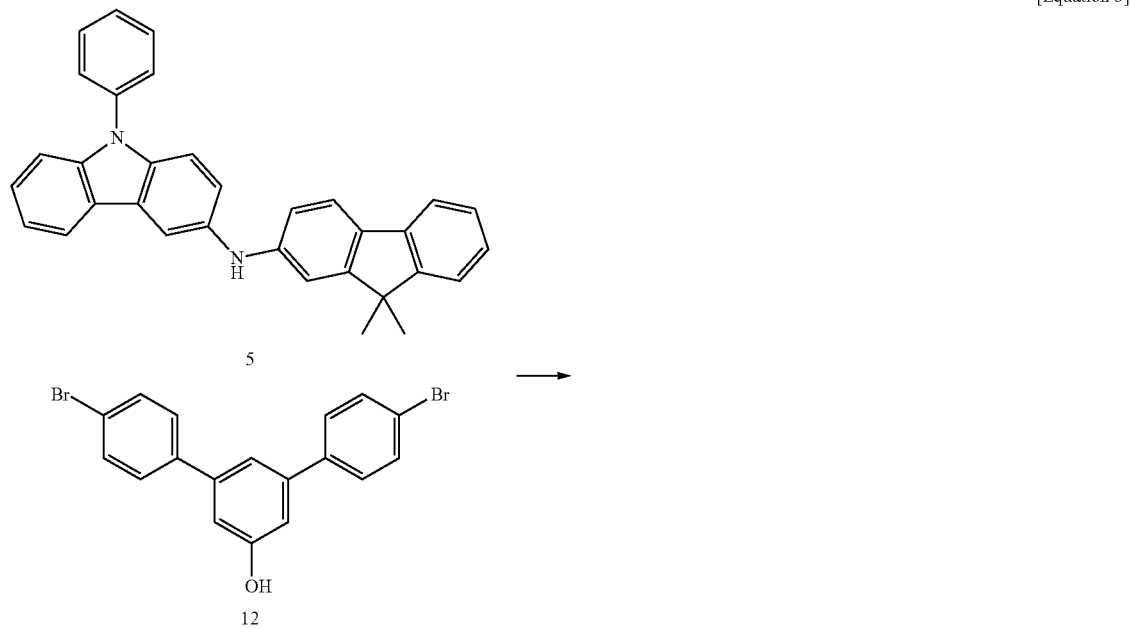

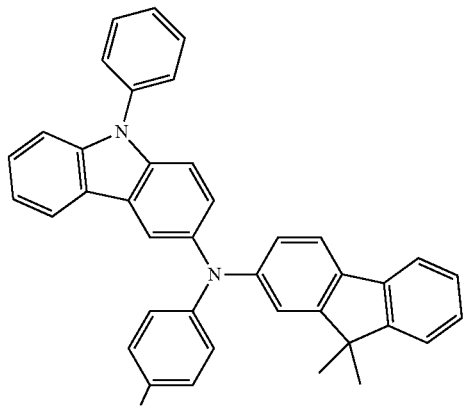
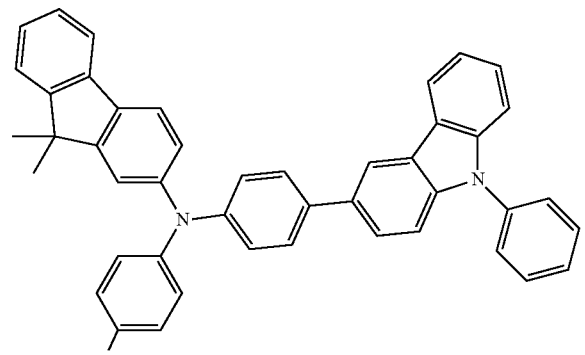
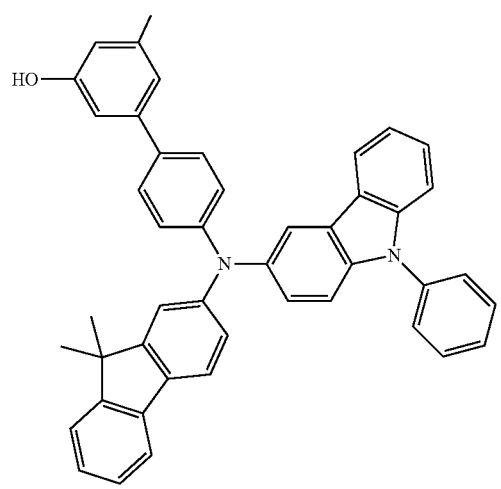
16
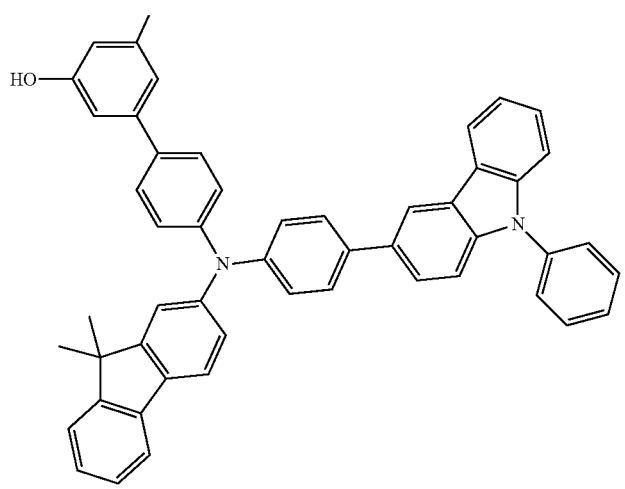
17
Synthesis of Dendrimer 1 (compound 20)
[Equation 4]
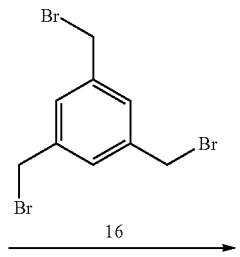
16
→
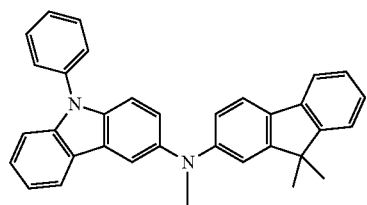

-continued

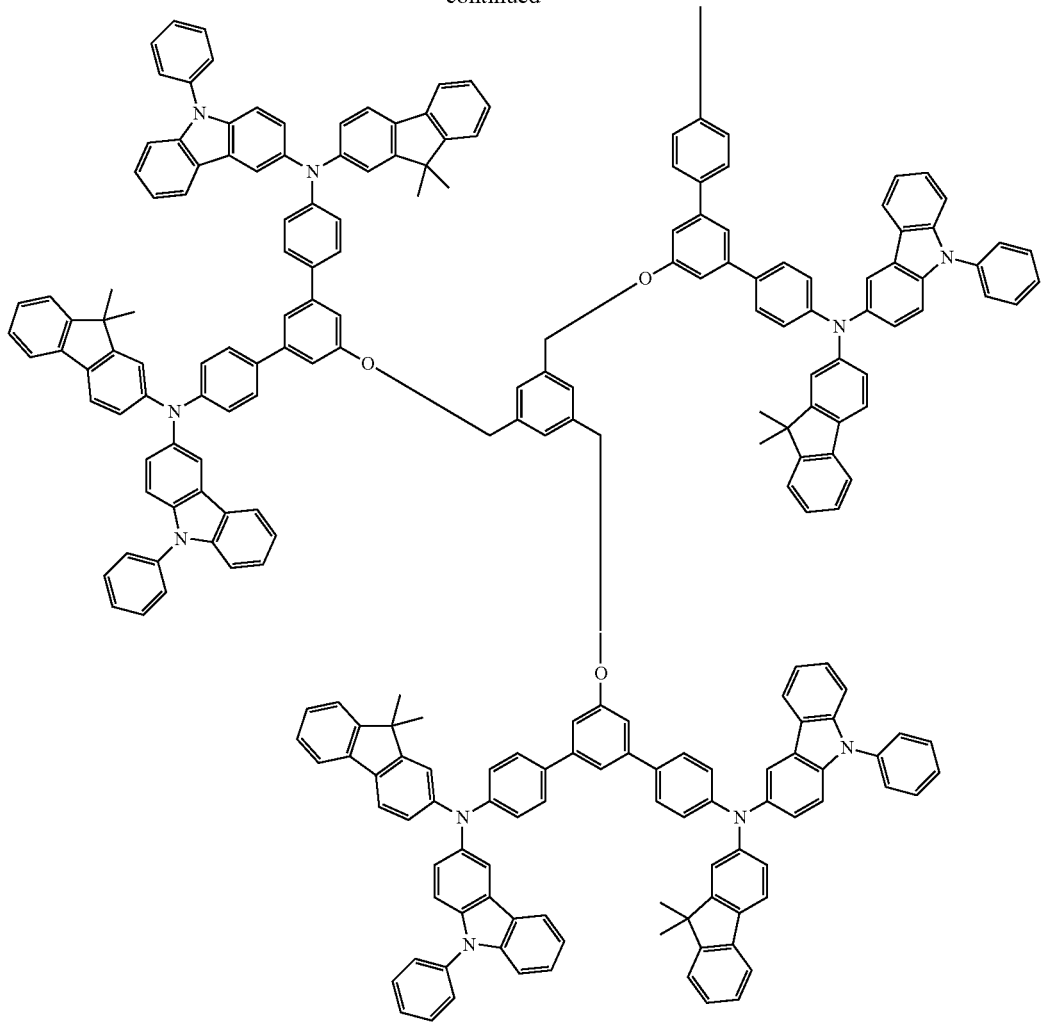

20

As illustrated in Equation 1, compound 1 obtained by using a mixture including fluorene, methyl iodide, KO$^t$Bu, and THF is subjected to reaction under a general nitration condition so as to obtain compound 2. Compound 2 and 0.5 g of 10% Pd on activated charcoal are subjected to reaction in 500 mL of ethanol so as to obtain compound 3. 85% of acetic acid is added to phenyl carbazole, iodine, and aperiodic acid to obtain compound 4. Toluene is added to a mixture including compound 4, compound 3, NaO$^t$Bu, Pd$_2$(dba)$_3$, and P$^t$Bu$_3$ and the mixture is subjected to reaction to obtain compound 5 in light-green solid form.

As illustrated in Equation 2, methanol is added to a mixture including p-bromobenzaldehyde, p-bromoacetophenone, and NaOH to obtain compound 11. Then, ethanol is added to a mixture including compound 11, bromide salt, and triethylamine to obtain compound 12.

As illustrated in Equation 3, toluene is added to a mixture including compound 5, compound 12, NaO$^t$Bu, Pd$_2$(dba)$_3$, and P$^t$Bu$_3$ and the mixture is subjected to reaction under a nitrogen atmosphere to obtain compound 16. Compound 17 is obtained by using other compound as a reactant as in the same manner as in compound 16.

As illustrated in Equation 4, THF is added to a mixture including 1,3,5-tris(bromomethyl)benzene penta erythritol tetrabromide and 95% NaH and the mixture is subjected to reaction to obtain Dendrimer 1 (compound 20).

The average molecular weight of the dendrimer of Dendrimer 1 (compound 20) prepared as above is from about 1,000 to 30,000.

Hereinafter, an organic light-emitting device including the dendrimer according to an embodiment will be described.

FIG. 1 is a diagram of the structure of an organic light-emitting device according to an embodiment.

First, an anode-forming material having a high work function is deposited or sputtered on a substrate to form an anode. The substrate may be a substrate conventionally used in organic light-emitting devices, and may include, for example, a glass substrate or a transparent plastic substrate with excellent mechanical strength, thermal stability, transparency, surface smoothness, ease of handling, and water resistance. The anode-forming material may be ITO, IZO, SnO$_2$, or ZnO, which are transparent and highly conductive.

Then, a hole injection layer (HIL) is formed on the anode by using a vacuum deposition, a spin coating, a casting, or a Langmuir-Blodgett (LB) method. However, when the HIL is formed using vacuum deposition, the HTL may be uniform, and occurrence of pin holes may be suppressed. When the HIL is formed by vacuum deposition, deposition conditions may vary according to a compound that is used to form the HIL, and according to the structure and thermal properties of the HIL to be formed. In general, however, conditions for vacuum deposition may include a deposition temperature ranging from about 50 to about 500° C., a pressure of from about $10^{-8}$ to about $10^{-3}$ torr, a deposition speed ranging from about 0.01 to about 100 Å/sec, and a layer thickness ranging from about 10 Å to about 5 μm. A material used to form the HIL may be any known hole injecting material, e.g., a phthalocyanine compound (e.g., copper phthalocyanine) disclosed in U.S. Pat. No. 4,356,429 or a Starburst-type amine derivative (e.g., TCTA, m-MTDATA, or m-MTDAPB) disclosed in *Advanced Material*, Volume 6, Issue 9, p. 677-679(1994).

A hole transport layer (HTL) may be formed on the HIL by using a vacuum deposition, a spin coating, a casting, or an LB method. However, when the HTL is formed using vacuum deposition, the HTL may be uniform, and occurrence of pin holes may be suppressed. When the HTL are formed using vacuum deposition, the deposition conditions may be similar to those for the formation of the HIL, although the deposition and coating conditions may vary according to a material that is used to form the HTL. A material used to form the HTL may be any known hole transporting material, e.g., a dendrimer compound including a dendron unit represented by Formula 1. Examples of the HTL-forming material include, but are not limited to, cabazol derivatives such as N-phenylcarbazol or polyvinylcarbazol, and amine derivatives having an aromatic condensed ring, such as N,N'-bis(3-methylphenyl)-N,N'-diphenyl[1,1-biphenyl]-4,4'-diamine (TPD), and N,N'-di(naphthalene-1-yl)-N,N'-diphenyl benzidine (α-NPD). The thickness of the HTL may be from about 50 to 1,000 Å, for example, from about 100 to about 600 Å. When the thickness of the HTL is within the above range, the HTL may have excellent hole transport characteristics without a substantial increase in driving voltage.

An emission layer (EML) may be formed on the HTL by using vacuum deposition, spin coating, casting, or LB deposition. However, when the EML is formed using vacuum deposition, the EML may be uniform, and occurrence of pin holes may be suppressed. When the EML is formed by using vacuum deposition, the deposition conditions may be similar to those for the formation of the HIL, although the deposition conditions may vary according to the material that is used to form the EML. As an EML-forming material, a dendrimer compound including a dendron unit represented by Formula 1 may be used alone or as a host, but the EML-forming material is not limited thereto.

If the dendrimer compound including the dendron unit represented by Formula 1 is used as an emission host, the EML may be used using the dendrimer compound with a phosphorescent or fluorescent dopant. In this regard, the fluorescent dopant may be IDE102 or IDE105 purchased from Idemitsu (Tokyo, Japan). Examples of green phosphorescent dopants may include, but are not limited to, Ir(ppy)$_3$, where "ppy" denotes phenylpyridine, Ir(ppy)$_2$(acac), Ir(mpyp)$_3$, and C545T. Examples of blue phosphorescent dopants include, but are not limited to, F$_2$Irpic, (F$_2$ppy)$_2$Ir(tmd), Ir(d-fppz)$_3$, ter-fluorene, 4,4'-bis(4-diphenylaminostyryl)biphenyl (DPAVBi), and 2,5,8,11-tetra-t-butyl pherylene (TBPe). Examples of red phosphorescent dopants may include, but are not limited to, platinum(II) octaethylporphyrin (PtOEP), Ir(piq)$_3$, Btp$_2$Ir(acac), DCJTB, and RD61 produced by UDC.

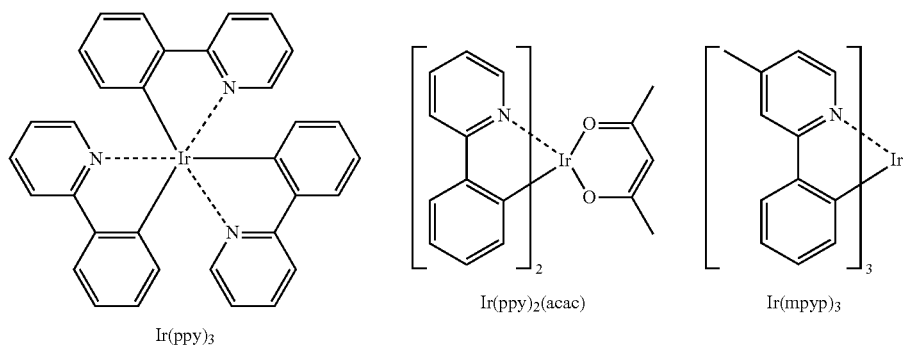

Ir(ppy)$_3$     Ir(ppy)$_2$(acac)     Ir(mpyp)$_3$

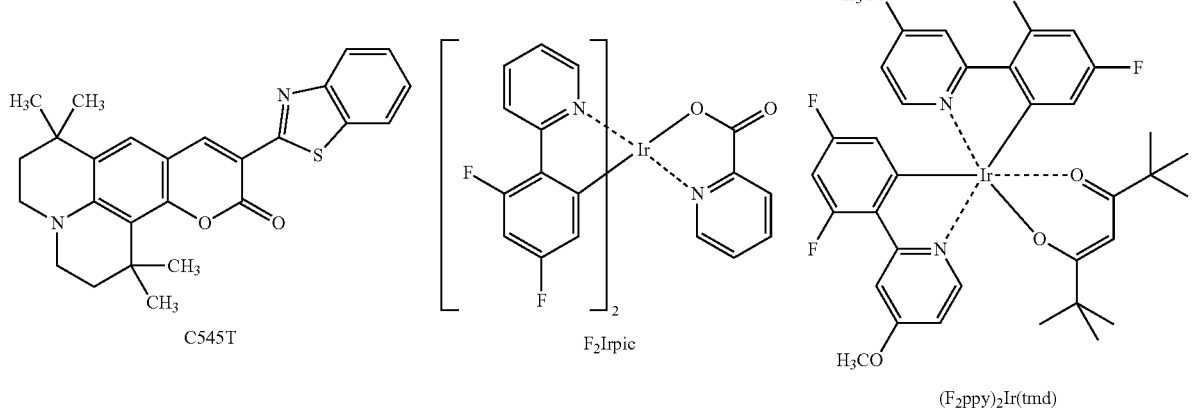

C545T     F$_2$Irpic     (F$_2$ppy)$_2$Ir(tmd)

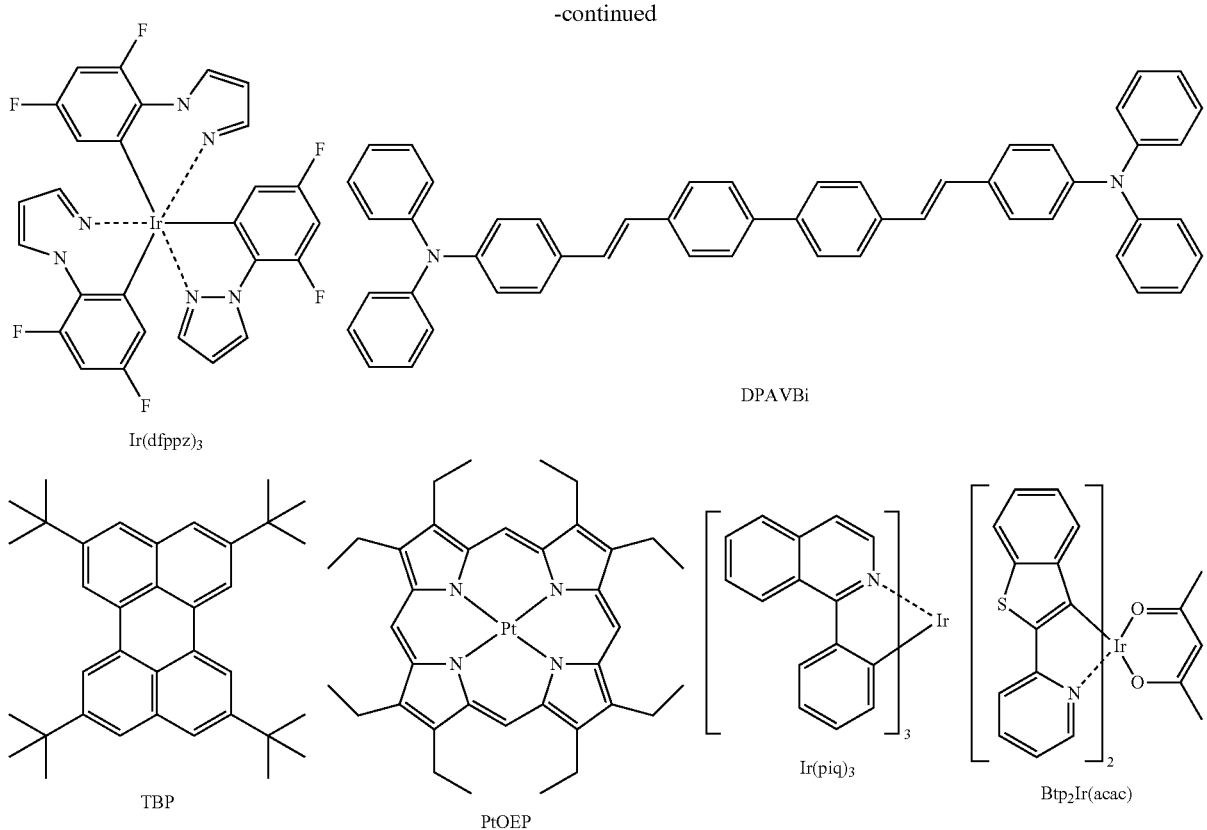

The doping concentration of a dopant is not particularly limited. The content of the dopant may be from about 0.01 to 15 parts by weight based on 100 parts by weight of the host. If the content of the dopant is within the above range, the EML may have excellent light-emitting characteristics and concentration quenching may be substantially prevented. When the EML includes a phosphorescent dopant, a hole blocking material may be further deposited or spin-coated on the EML to prevent diffusion of triplet excitons or holes into an electron transport layer (ETL). In this case, the hole blocking material may be any known material that is commonly used in the art without limitation. For example, the hole blocking material may include an oxadiazole derivative, a triazole derivative, a phenanthroline derivative, a hole blocking material disclosed in Japanese Patent No. hei 11-329734 (A1), the contents of which are incorporated herein by reference, and for example, Balq represented by the following formula, and phenanthrolines (e.g.,: BCP produced by UDC).

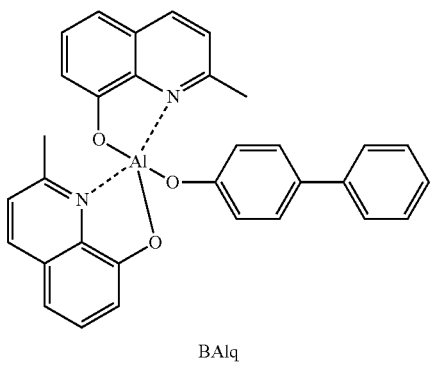

BAlq

The thickness of the EML may be from about about 100 to about 1,000 Å, for example, about 200 to about 600 Å. When the thickness of the EML is within these ranges, the EML may have excellent light-emitting characteristics without a substantial increase in driving voltage.

When the EML includes a phosphorescent dopant, a HBL (not shown in FIG. 1) including the hole blocking material may be formed on the EML in order to prevent diffusion of triplet excitons or holes into the ETL for the same purpose of adding the hole blocking material to the EML.

An ETL may be formed on the EML by using vacuum deposition, spin coating, casting, or the like, for example, vacuum deposition. An ETL-forming material may be any material capable of stably transporting electrons injected from the electron injection electrode (cathode), for example, a quinoline derivative, particularly, tris(8-quinolinorate)aluminum (Alq3). In addition, an electron injection layer (EIL) may be formed on the ETL using any material that allows electrons to be easily injected from the cathode. The EIL may comprise LiF, NaCl, CsF, $Li_2O$, BaO, or the like. The thickness of the ETL may be from about 100 to about 1,000 Å, for example, about 100 to about 500 Å. When the thickness of the ETL is within the above range, the ETL may have excellent electron transport characteristics without a substantial increase in driving voltage.

Deposition conditions for forming the HBL, ETL, and EIL are similar to those used to form the HIL, although the deposition conditions may vary according to the material that is used to form the HBL, ETL, and EIL.

A cathode-forming metal is formed on the EIL by using vacuum deposition or sputtering to form a cathode. Examples of the cathode-forming metal include a metal, an alloy, and an electrically conductive compound, and a mixture thereof. Examples of such materials include lithium (Li), magnesium (Mg), aluminum (Al), aluminum-lithium (Al—Li), calcium (Ca), magnesium-indium (Mg—In), and magnesium-silver (Mg—Ag). In addition, a transparent cathode comprising ITO or IZO may be used to manufacture a top-emission light-emitting device.

According to embodiments, the organic light-emitting device may have the structure of FIG. 1 in which the anode, the HIL, the HTL, the EML, the ETL, the EIL, and the cathode are stacked on one another. However, the organic light-emitting device may have any of a variety of structures. For example, the organic light-emitting device may further include one or two intermediate layers, if needed. The HIL, EIL, and HBL are not essential but may improve emission efficiency.

Hereinafter, compound 5 and compound 10 having at least one fluorene group and one carbazole group as side chains will be described more fully with reference to the following synthesis examples and examples. However, the following examples are only for illustrative purpose and are not intended to limit the scope of the embodiments. The dendrimer including Dendron of compound 5 or 10 has excellent emitting and hole transporting capabilities and may be used as a blue emitting material, green and red phosphorescent host materials, green and red fluorescent host materials, and a hole transporting material.

Synthesis Example 1

Synthesis of Compound 5

Dendron Unit

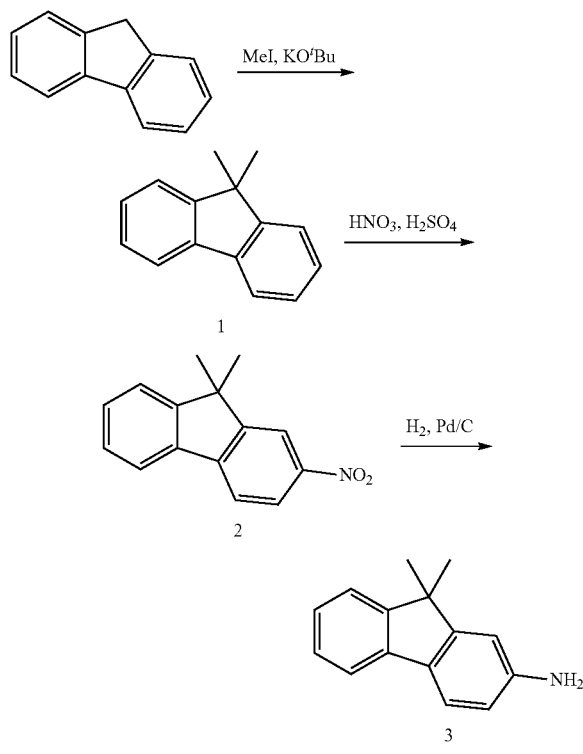

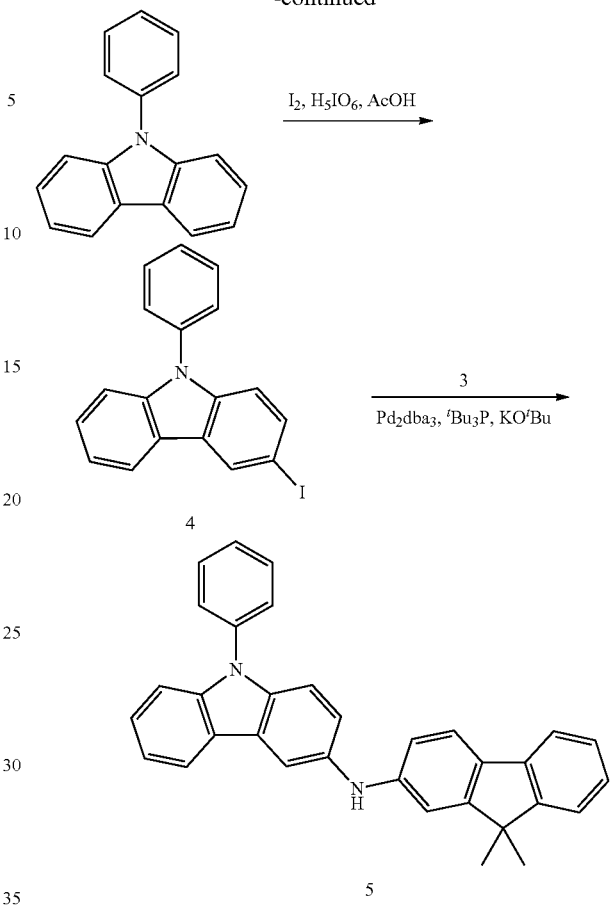

A mixture including 16.6 g (100.0 mmol) of fluorene, 42.5 g (300.0 mmol) of methyl iodide, 28.0 g (250.0 mmol) of KO$^t$Bu, and 600 mL of THF was stirred for 12 hours in a nitrogen atmosphere. 200 mL of water was added to the reaction mixture, and the reaction mixture was subjected to extraction twice with 500 mL ethyl acetate. The resultant organic layer was dried, filtered, concentrated, and then separated using column chromatography to obtain 16.7 g of compound 1 in light-yellow liquid form with a yield of 86%.

19.4 g (100.0 mmol) of compound 1 was subjected to reaction under a nitration condition and then separated using column chromatography to obtain 17.7 g of compound 2 in light-yellow solid form with a yield of 74%.

23.9 g (100.0 mmol) of compound 2 and 0.5 g of 10% Pd on activated charcoal were diluted with 500 mL of ethanol and stirred for 24 hours in a hydrogen atmosphere. The reactant was filtered to remove a catalyst, concentrated, and then separated using column chromatography to obtain 16.9 g of compound 3 in light-yellow solid form with a yield of 81%. The structure of compound 3 was identified using high-resolution mass spectrometry (HR-MS). (calc.: 209.1204, found: 209.1194)

400 mL of 85% acetic acid was added to a mixture including 24.3 g (100.0 mmol) of phenyl carbazole, 13.4 g (50.3 mmol) of iodine, and 2.2 g (10.0 mmol) of periodic acid, and the mixture was heated at 80° C. for 4 hours. 500 mL of cold water was added to the reaction mixture, and the reaction mixture was stirred and filtered. A solid phase obtained by the filtration was cleaned with cold water several times. Then, the solid phase was dissolved in 400 mL of ethyl ether, dried, filtered, concentrated, and then separated using column chromatography to obtain 28.7 g of compound 4 in white solid form with a yield of 78%. The structure of compound 4 was identified using HR-MS. (calc.: 369.0014, found: 369.0001)

100 mL of toluene was added to a mixture including 11.1 g (30.0 mmol) of compound 4, 7.53 g (39.0 mmol) of compound 3, 4.3 g (45.0 mmol) of NaO$^t$Bu, 1.4 g (1.5 mmol) of Pd$_2$(dba)$_3$, and 0.30 g (1.5 mmol) of PtBu$_3$ and then the mixture was heated at 90° C. in a nitrogen atmosphere for 6 hours. The reaction mixture was cooled to room temperature, 30 mL of water was further added to the reaction mixture, and the reaction mixture was subjected to extraction twice with 200 mL of methylene chloride. The resultant organic layer was dried, filtered, concentrated, and then separated using column chromatography to obtain 8.38 g of compound 5 in light-green solid form with a yield of 62%. The structure of compound 5 was identified using HR-MS. (calc.: 450.2096, found: 450.2091)

Synthesis Example 2

Synthesis of Compound 10

Dendron Unit

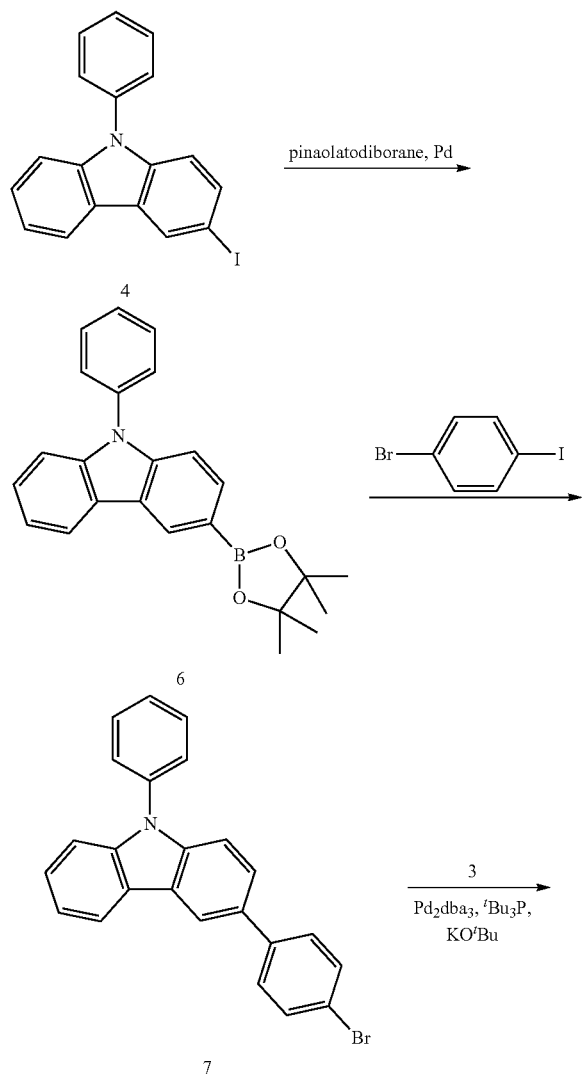

-continued

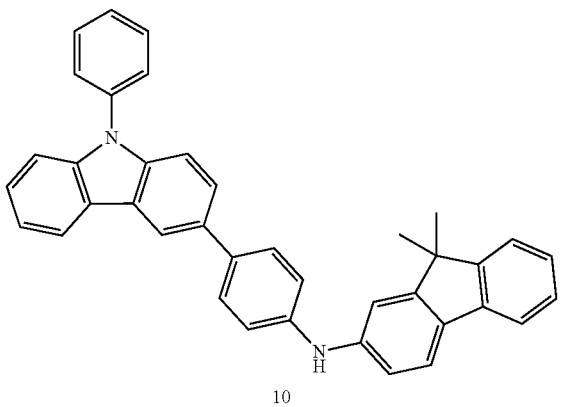

100 mL of toluene was added to a mixture including 11.1 g (30.0 mmol) of compound 4, 9.1 g (36.0 mmol) of bis(pinacolato)diboron, 1.2 g (0.05 mole %) of Pd(dppf)Cl$_2$, and 3.5 g (36 mmol) of KO$^t$Bu, and then the mixture was heated at 90° C. in a nitrogen atmosphere for 6 hours. The reaction mixture was cooled to room temperature, 50 mL of water was further added to the reaction mixture, and the reaction mixture was subjected to extraction twice with 300 mL of methylene chloride. The resultant organic layer was dried, filtered, concentrated, and then separated using column chromatography to obtain 8.74 g of compound 6 in pale yellow solid form with a yield of 79%.

100 mL of methanol was added to a mixture including 11.1 g (30.0 mmol) of compound 6, 12.7 g (45.0 mmol) of 4-iodine bromide benzene, 1.7 g (5 mole %) of Pd(PPh$_3$)$_4$, and 4.8 g (120 mmol) of NaOH, and then the mixture was heated at 60° C. in a nitrogen atmosphere for 12 hours. The reaction mixture was cooled to room temperature, 50 mL of water was further added to the reaction mixture, and the reaction mixture was subjected to extraction twice with 300 mL of methylene chloride. The resultant organic layer was dried, filtered, concentrated, and then separated using column chromatography to obtain 7.76 g of compound 7 in pale yellow solid form with a yield of 65%. The structure of compound 7 was identified using HR-MS. (calc.: 397.0466, found: 397.0454)

100 mL of toluene was added to a mixture including 11.9 g (30.0 mmol) of compound 7, 7.53 g (39.0 mmol) of compound 3, 4.3 g (45.0 mmol) of NaO$^t$Bu, 1.4 g (1.5 mmol) of Pd$_2$(dba)$_3$, and 0.30 g (1.5 mmol) of PtBu$_3$ and then the mixture was heated at 90° C. in a nitrogen atmosphere for 6 hours. The reaction mixture was cooled to room temperature, 30 mL of water was further added to the reaction mixture, and the reaction mixture was subjected to extraction twice with 200 mL of methylene chloride. The resultant organic layer was dried, filtered, concentrated, and then separated using column chromatography to obtain 11.6 g of compound 10 in pale yellow solid form with a yield of 74%. The structure of compound 10 was identified using HR-MS. (calc.: 526.2409, found: 526.2413)

Synthesis Example 3

Synthesis of Compound 12

Bridge Unit

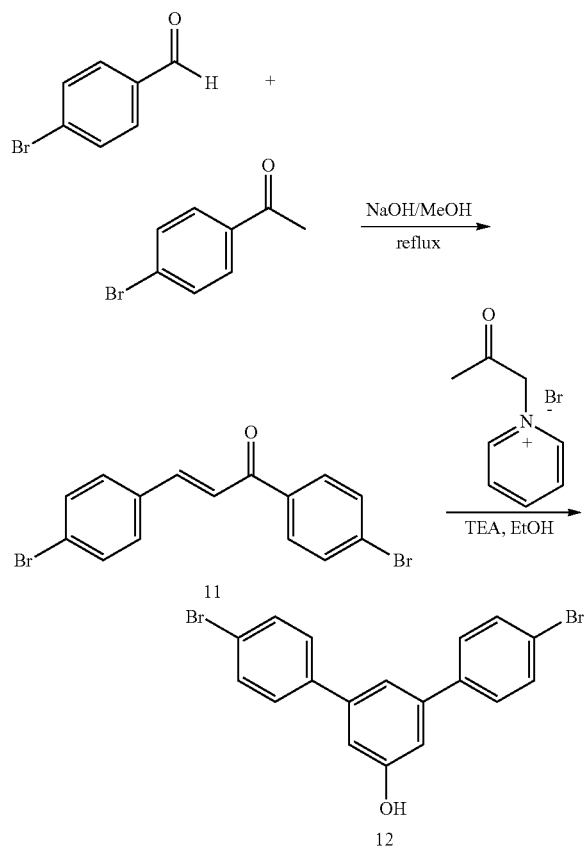

300 mL of methanol was added to a mixture including 18.5 g (100 mmol) of p-bromobenzaldehyde, 19.9 g (100 mmol) of p-bromoacetophenone, and 20 g (5 mmol) of NaOH, and then the mixture was heated at 60° C. in a nitrogen atmosphere for 12 hours. The reaction mixture was cooled to room temperature, 200 mL of water was further added to the reaction mixture, and the reaction mixture was subjected to extraction twice with 300 mL of methylene chloride. The resultant organic layer was dried, filtered, concentrated, and then separated using column chromatography to obtain 23.8 g of compound 11 in pale yellow solid form with a yield of 65%. The structure of compound 11 was identified using HR-MS. (calc.: 363.9098, found: 363.9085)

100 mL of ethanol was added to a mixture including 11.1 g (30.0 mmol) of compound 11, 9.7 g (45.0 mmol) of bromide salt, and 6.1 g (60 mmol) of triethylamine and then the mixture was heated at 60° C. in a nitrogen atmosphere for 24 hours. The reaction mixture was cooled to room temperature, 200 mL of water was further added to the reaction mixture, and the reaction mixture was subjected to extraction twice with 300 mL of methylene chloride. The resultant organic layer was dried, filtered, concentrated, and then separated using column chromatography to obtain 7.5 g of compound 12 in pale yellow solid form with a yield of 62%. The structure of compound 12 was identified using HR-MS. (calc.: 401.9255, found: 401.9247)

Synthesis Example 4

Synthesis of Compound 13

Bridge Unit

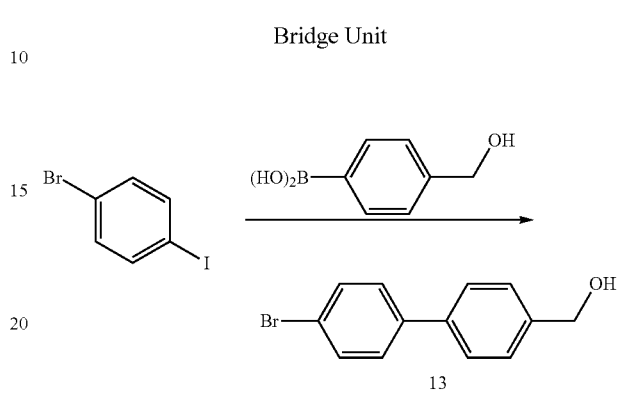

100 mL of THF was added to a mixture including 4.5 g (30 mmol) of boronic acid, 12.7 g (45 mmol) of 4-iodine bromide benzene, 1.7 g (5 mole %) of Pd(PPh$_3$)$_4$, 4.8 g (120 mmol) of NaOH, and 30 mL of H$_2$O, and then the mixture was heated at 70° C. in a nitrogen atmosphere for 12 hours. The reaction mixture was cooled to room temperature, 50 mL of water was further added to the reaction mixture, and the reaction mixture was subjected to extraction twice with 200 mL of methylene chloride. The resultant organic layer was dried, filtered, concentrated, and then separated using column chromatography to obtain 5.68 g of compound 13 in pale yellow solid form with a yield of 72%. The structure of compound 13 was identified using HR-MS. (calc.: 261.9993, found: 261.9981)

Synthesis Example 5

Synthesis of Compounds 14, 15, 16, and 17

Combination of Dendron Unit and Bridge Unit

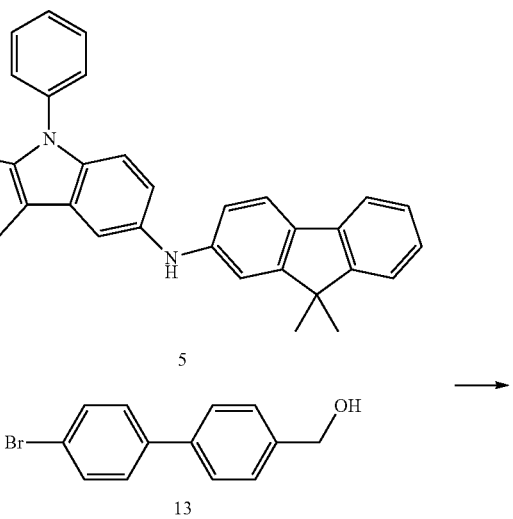

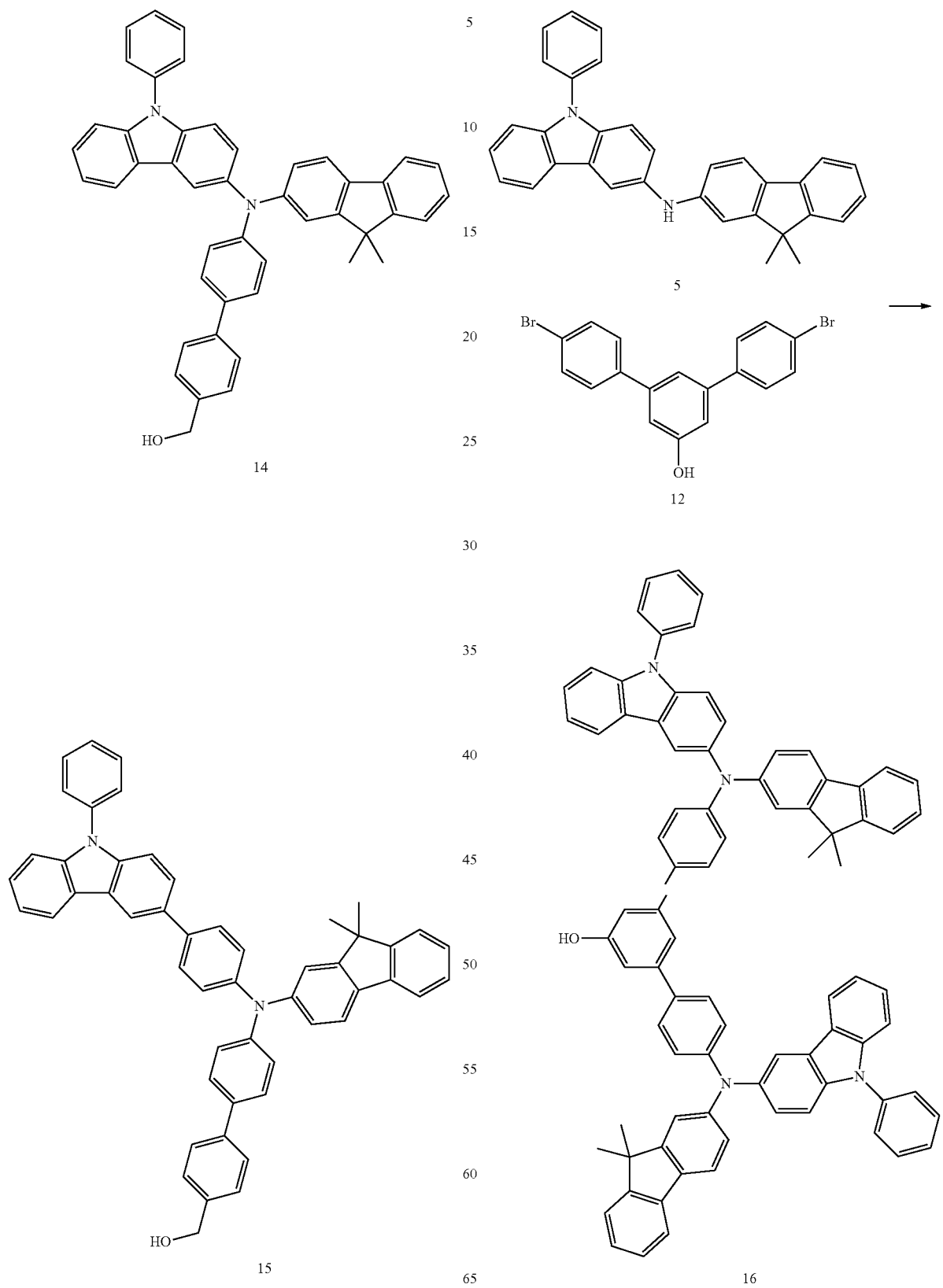

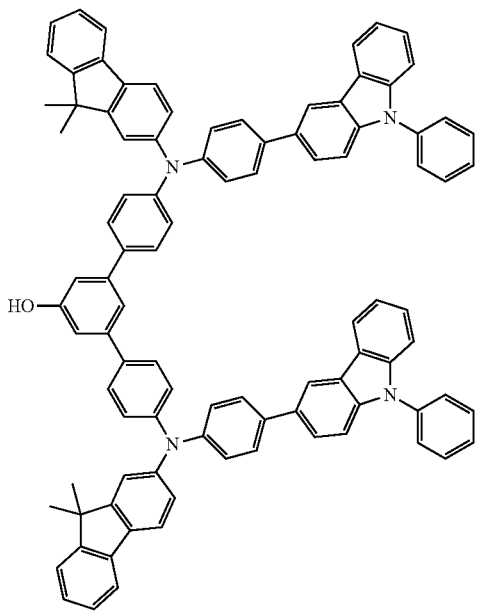

17

150 mL of toluene was added to a mixture including 13.5 g (100 mmol) of compound 5, 9.47 g (36 mmol) of compound 13, 4.3 g (45.0 mmol) of NaO^tBu, 1.4 g (1.5 mmol) of Pd$_2$(dba)$_3$, and 0.30 g (1.5 mmol) of P^tBu$_3$, and then the mixture was heated at 90° C. in a nitrogen atmosphere for 6 hours. The reaction mixture was cooled to room temperature, 30 mL of water was further added to the reaction mixture, and the reaction mixture was subjected to extraction twice with 200 mL of methylene chloride. The resultant organic layer was dried, filtered, concentrated, and then separated using column chromatography to obtain 13.3 g of compound 14 in pale yellow solid form with a yield of 70%. The structure of compound 14 was identified using HR-MS. (calc.: 632.2828, found: 632.2812)

15.1 g of compound 15 in pale yellow solid form with a yield of 71% was synthesized using compound 5 and compound 10 in the same manner as in the synthesis of compound. The structure of compound 15 was identified using HR-MS. (calc.: 708.3141, found: 708.3130)

22.9 g of compound 16 in pale yellow solid form with a yield of 68% was synthesized using compound 5 (2 equivalent weight) and compound 12 in the same manner as in the synthesis of compound. The structure of compound 16 was identified using HR-MS. (calc.: 1142.4924, found: 1142.4912)

24.0 g of compound 17 in pale yellow solid form with a yield of 62% was synthesized using compound 10 (2 equivalent weight) and compound 12 in the same manner as in the synthesis of compound. The structure of compound 17 was identified using HR-MS. (calc.: 1294.5550, found: 1294.5538)

Synthesis Example 6

Synthesis of Compounds 18, 19, 20, and 21

Dendrimer

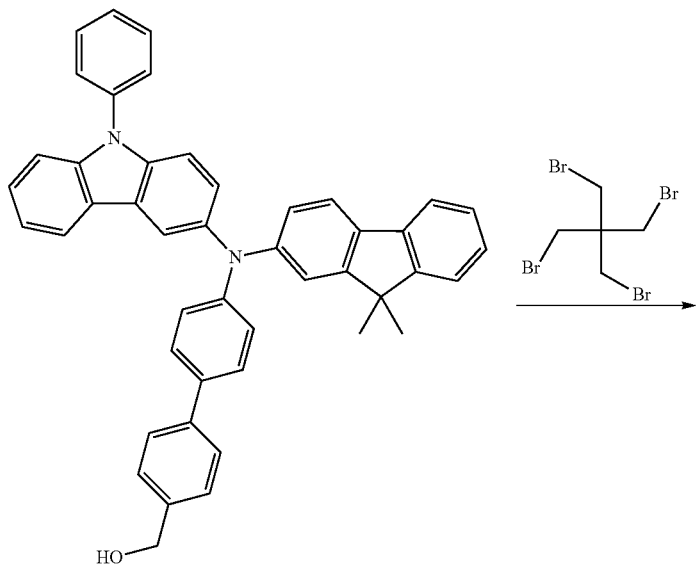

14

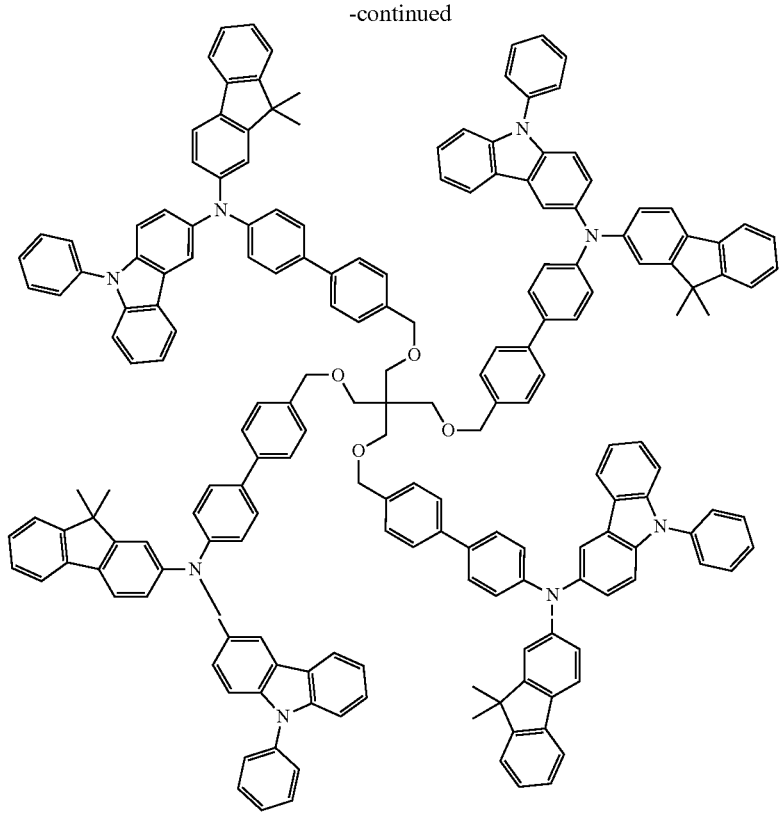

18

80 mL of THF was added to a mixture including 6.33 g (10.0 mmol) of compound 14, 770 mg (2.0 mmol) of pentaerythritol tetrabromide, and 480 mg (20.0 mmol) of 95% NaH, and the mixture was stirred at room temperature for 1 hour and heated at 50° C. for 6 hours. The reaction mixture was cooled to room temperature, 30 mL of water was further added to the reaction mixture, and the reaction mixture was subjected to extraction twice with 100 mL of methylene chloride. The resultant organic layer was dried, filtered, concentrated, and then separated using column chromatography to obtain 2.90 g of compound 18 in pale-yellow solid form with a yield of 56%. The structure of compound 18 was identified using NMR spectroscopy. $^1$H-NMR (CDCl$_3$, 400 MHz) δ (ppm); 1.76 (s, 24H), 3.28 (s, 8H), 4.53 (s, 8H), 6.22-6.87 (m, 24H), 7.02-8.10 (m, 84H).

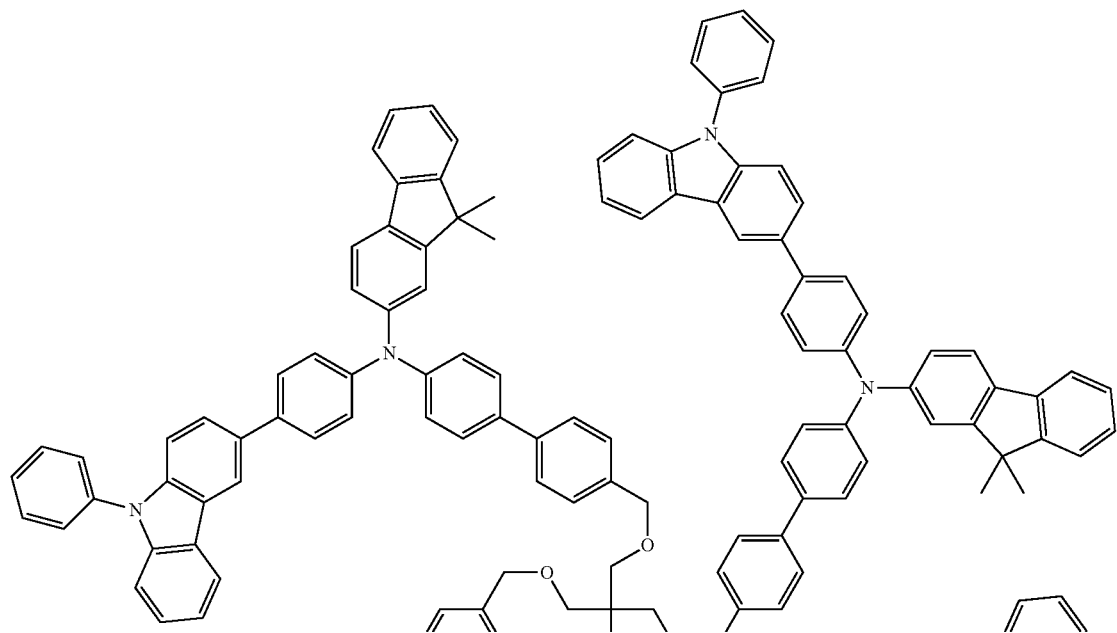

19

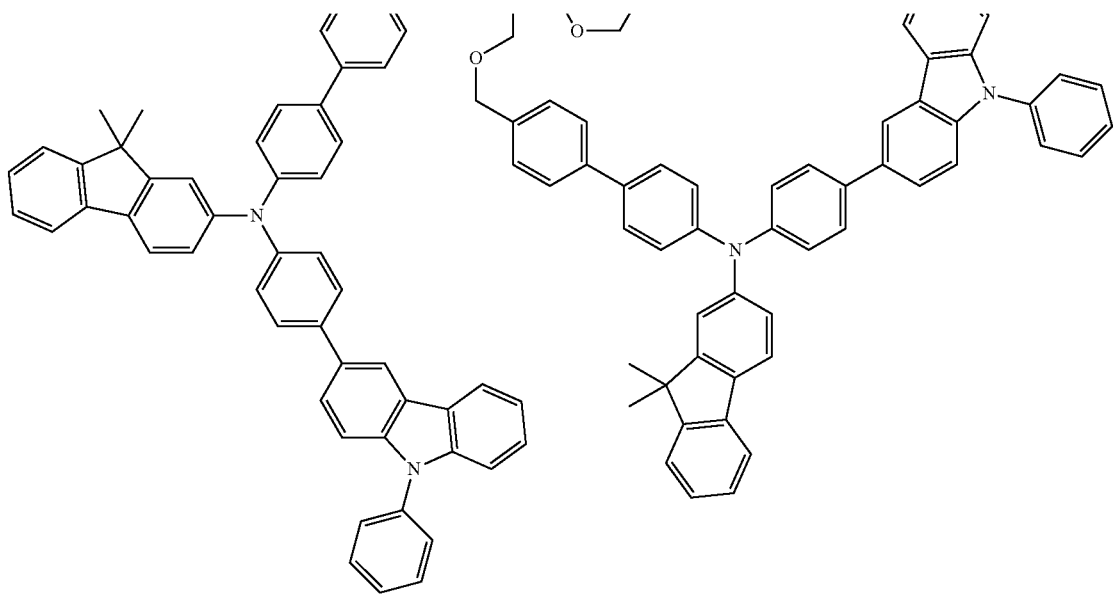
2.72 g of compound 19 in pale-yellow solid form with a yield of 47% was synthesized using 7.08 g (10.0 mmol) of compound 15 in the same manner as in the synthesis of compound 18. The structure of compound 19 was identified using NMR spectroscopy. $^1$H-NMR (CDCl13, 400 MHz) δ (ppm); 1.66 (s, 24H), 3.15 (s, 8H), 4.44 (s, 8H), 6.34-6.82 (m, 32H), 7.12-8.12 (m, 92H).
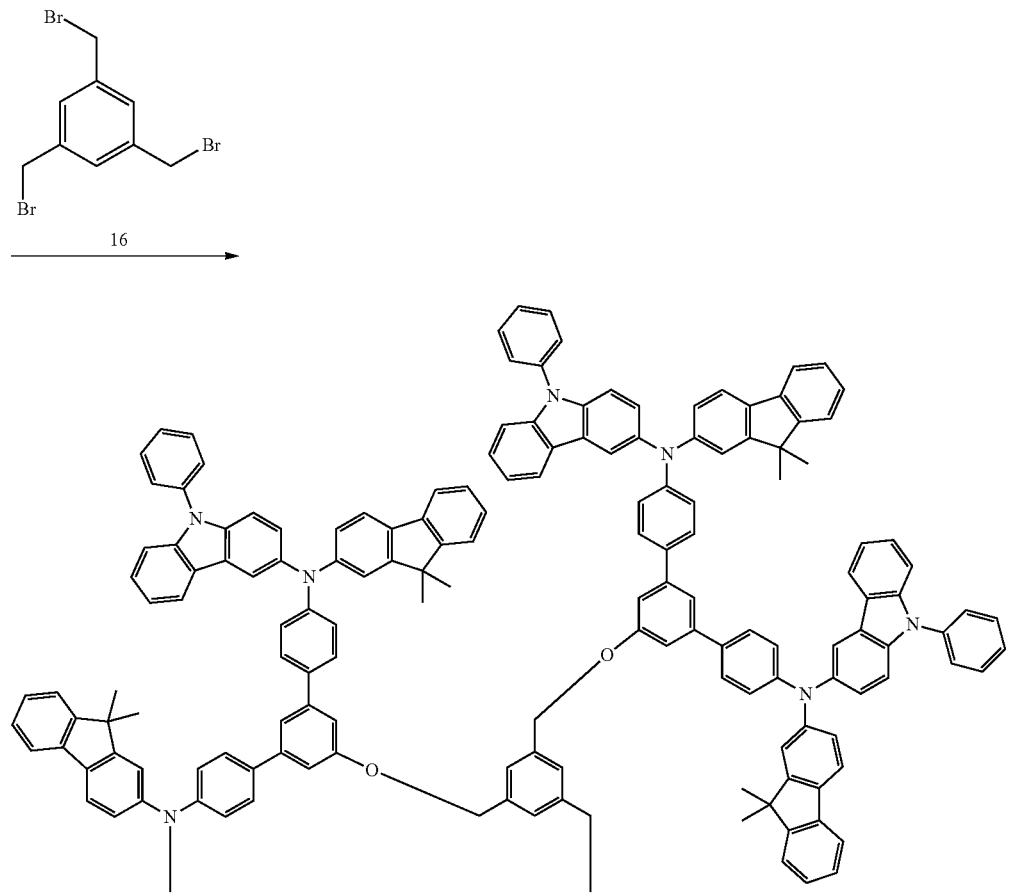

-continued

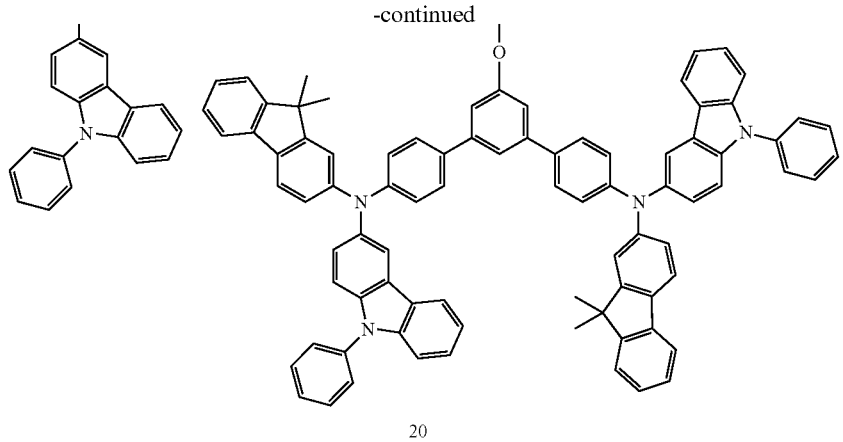

20

80 mL of THF was added to a mixture including 11.4 g (10.0 mmol) of compound 16, 707 mg (2.0 mmol) of 1,3,5-tris(bromomethyl)benzene pentaerythritol tetrabromide, and 480 mg (20.0 mmol) of 95% NaH, and the mixture was stirred at room temperature for 1 hour and heated at 50° C. for 6 hours. The reaction mixture was cooled to room temperature, 30 mL of water was further added to the reaction mixture, and the reaction mixture was subjected to extraction twice with 100 mL of methylene chloride. The resultant organic layer was dried, filtered, concentrated, and then separated using column chromatography to obtain 2.34 g of compound 20 (dendrimer 1) in pale-yellow solid form with a yield of 33%. The structure of compound 20 (dendrimer 1) was identified using NMR spectroscopy. $^1$H-NMR (CDCl$_3$, 400 MHz) δ (ppm); 1.53 (s, 36H), 5.03 (s, 6H), 6.24-8.12 (m, 150H).

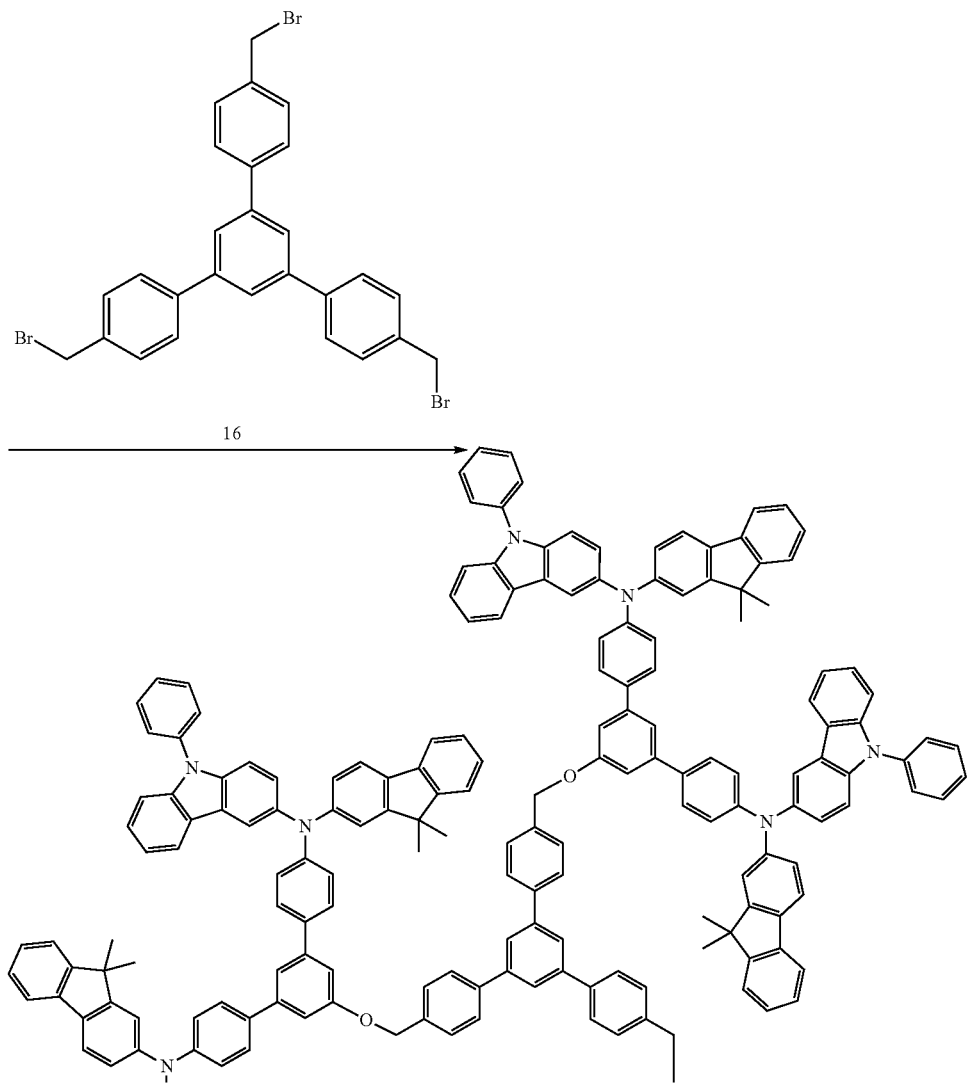

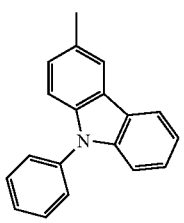
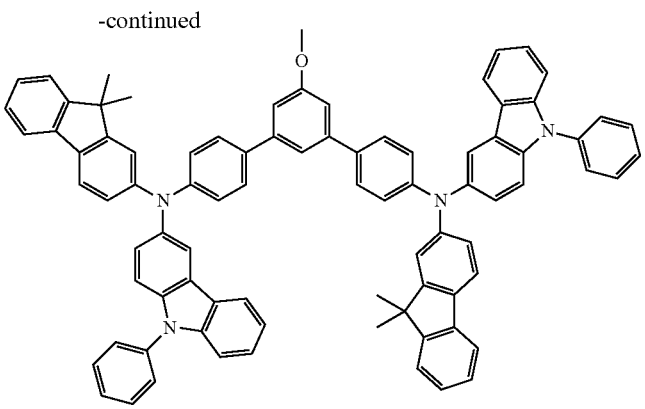

21

2.33 g of compound 21 in pale-yellow solid form with a yield of 31% was synthesized using 7.08 g (10.0 mmol) of compound 16 and 1.17 g (2.0 mmol) of 1,3,5-tris(bromomethyl)benzene in the same manner as in the synthesis of compound 20. (2.33 g, 31%) $^1$H-NMR (CDCl3, 400 MHz) δ (ppm); 1.55 (s, 36H), 5.43 (s, 6H), 6.22-8.23 (m, 162H).

Example 1

To manufacture an anode, a Corning (Midland, Mich.) 15 Ω/cm² (1200 Å) ITO glass substrate was cut to a size of 50 mm×50 mm×0.7 mm and then sonicated in isopropyl alcohol and pure water each for five minutes, and then cleaned by irradiation of ultraviolet (UV) rays for 30 minutes and exposure to ozone. The resulting glass substrate was loaded into a vacuum deposition device.

A HIL was formed on the substrate by spin-coating a PEDOT/PSS aqueous solution (produced by H. C. Starck) to a thickness of 40 nm. Then, a HTL was formed on the HIL by spin-coating compound 18 prepared in Synthesis Example 6 to a thickness of 80 nm. Then, a green fluorescent host (Alq$_3$) and a green fluorescent dopant (C545T) were simultaneously deposited in a weight ratio of 98:2 on the HTL, to form an EML having a thickness of about 300 Å.

Then, Alq$_3$ was deposited on the EML to form an ETL having a thickness of about 300 Å, and then LiF (which is halogenated alkali metal) was deposited on the ETL to form an EIL having a thickness of about 10 Å. Then, Al was vacuum-deposited on the EIL to a thickness of about 3000 Å to form a LiF/Al electrode (cathode), thereby completing the manufacture of an organic light-emitting device.

The organic light-emitting device had a driving voltage of 5.75 V at a current density of 50 mA/cm², a high luminance of 8,455 cd/m², color coordinates of (0.315, 0.642), and a luminescent efficiency of 16.91 cd/A.

Example 2

An organic light-emitting device was manufactured in the same manner as in Example 1, except that compound 19 was used instead of compound 18 to form the HTL.

The organic light-emitting device had a driving voltage of 6.37 V at a current density of 50 mA/cm², a high luminance of 8,344 cd/m², color coordinates of (0.310, 0.623), and a luminescent efficiency of 16.69 cd/A.

Example 3

An organic light-emitting device was manufactured in the same manner as in Example 1, except that compound 20 was used instead of compound 18 to form the HTL.

The organic light-emitting device had a driving voltage of 5.57 V at a current density of 50 mA/cm², a high luminance of 8,496 cd/m², color coordinates of (0.311, 0.644), and a luminescent efficiency of 16.69 cd/A.

Example 4

An organic light-emitting device was manufactured in the same manner as in Example 1, except that compound 21 was used instead of compound 18 to form the HTL.

The organic light-emitting device had a driving voltage of 5.37 V at a current density of 50 mA/cm², a high luminance of 8,354 cd/m², color coordinates of (0.309, 0.633), and a luminescent efficiency of 16.71 cd/A.

Example 5

Compound 18 prepared in Example 5 and a green fluorescent dopant (C545T) were spin-coated in a weight ratio of 98:2 on the HIL (PEDOT/PSS) instead of the HTL to form an EML having a thickness of 30 nm. Then, Alq$_3$ was deposited on the EML to form an ETL having a thickness of about 300 Å, and then LiF (which is halogenated alkali metal) was deposited on the ETL to form an EIL having a thickness of about 10 Å. Then, Al was vacuum-deposited on the EIL to a thickness of about 3000 Å to form a LiF/Al electrode, thereby completing the manufacture of an organic light-emitting device.

The organic light-emitting device had a driving voltage of 6.35 V at a current density of 50 mA/cm², a high luminance of 7,221 cd/m², color coordinates of (0.310, 0.641), and a luminescent efficiency of 14.12 cd/A.

Comparative Example 1

An organic light-emitting device was manufactured in the same manner as in Example 1, except that the HTL was not formed.

The organic light-emitting device had a driving voltage of 7.45 V at a current density of 50 mA/cm², a high luminance of 6,102 cd/m², color coordinates of (0.309, 0.642), and a luminescent efficiency of 12.2 cd/A.

Characteristics such as color coordinates, luminance, and luminescent efficiency of the organic light-emitting devices are shown in Table 1 below.

TABLE 1

| | Dendrimer | Driving voltage (V) | Current Density (mA/cm$^2$) | Luminance (cd/m$^2$) | Efficiency (cd/A) | Color Coordinates | Half Life-span (hr @ 100 mA/cm$^2$) |
|---|---|---|---|---|---|---|---|
| Example 1 | Compound 18 (HTL) | 5.75 | 50 | 8455 | 16.91 | (0.315, 0.642) | 480 hr |
| Example 2 | Compound 19 HTL) | 6.37 | 50 | 8344 | 16.69 | (0.310, 0.623) | 508 hr |
| Example 3 | Compound 20 (HTL) | 5.57 | 50 | 8496 | 16.99 | (0.311, 0.644) | 523 hr |
| Example 4 | Compound 21 (HTL) | 5.37 | 50 | 8354 | 16.71 | (0.309, 0.633) | 538 hr |
| Example 5 | Compound 18 (EML) | 6.83 | 50 | 7064 | 14.12 | (0.310, 0.642) | 282 hr |
| Comparative Example 1 | — | 7.45 | 50 | 6102 | 12.2 | (0.309, 0.642) | 247 hr |

Driving voltages of the organic light-emitting devices manufactured according to Examples 1 to 5 were lower than that of the organic light-emitting device manufactured according to Comparative Example 1 by more than 1 V, and the organic light-emitting devices manufactured according to Examples 1 to 5 showed excellent I-V-L characteristics with high luminescent efficiency. In particular, life-spans of the organic light-emitting devices manufactured according to Examples 1 to 4 were greater than that of the organic light-emitting device manufactured according to Comparative Example 1 by more than 100%. In addition, if a dendrimer compound is used in an organic light-emitting device for forming an EML, the organic light-emitting device has low driving voltage and high emission efficiency, but life-span was not changed.

Since a dendrimer according to an embodiment has high electrical stability, excellent charge transporting capability, and high emission capability, it may be dissolved in an organic solvent to form a HIL or a HTL of an organic light-emitting device.

According to another embodiment, an organic light-emitting device manufactured using the dendrimer has high emission efficiency and excellent luminance.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. A dendrimer compound comprising a core unit, a bridge unit, and a dendron unit,
   wherein the core unit comprises a functional group selected from the group consisting of functional groups represented by Formulas 11 to 15 below:

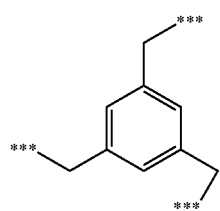

<Formula 11>

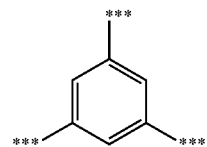

<Formula 12>

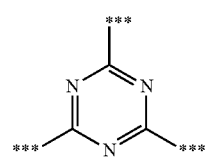

<Formula 13>

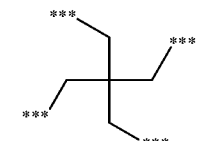

<Formula 14>

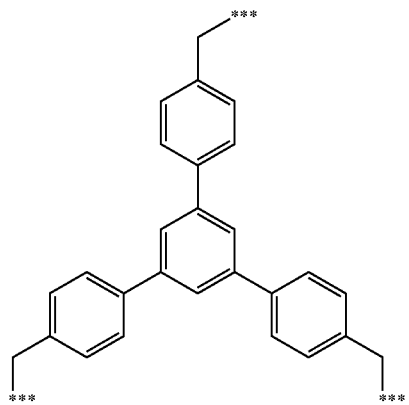

<Formula 15> where *** is a binding site with the bridge unit wherein the bridge unit comprises a divalent or trivalent functional group selected from the group consisting of a substituted or unsubstituted $C_6$-$C_{50}$ aromatic hydrocarbon and a substituted or unsubstituted $C_3$-$C_{50}$ hetero aromatic hydrocarbon, and wherein the dendron unit comprises a monovalent fluorene-based functional group represented by Formula 1 below:

<Formula 1>

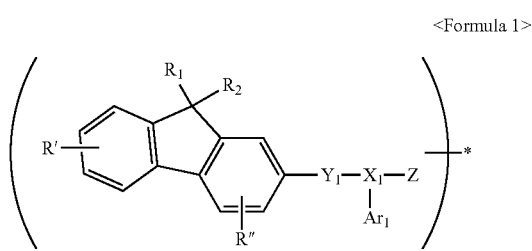

where Z is selected from the group consisting of

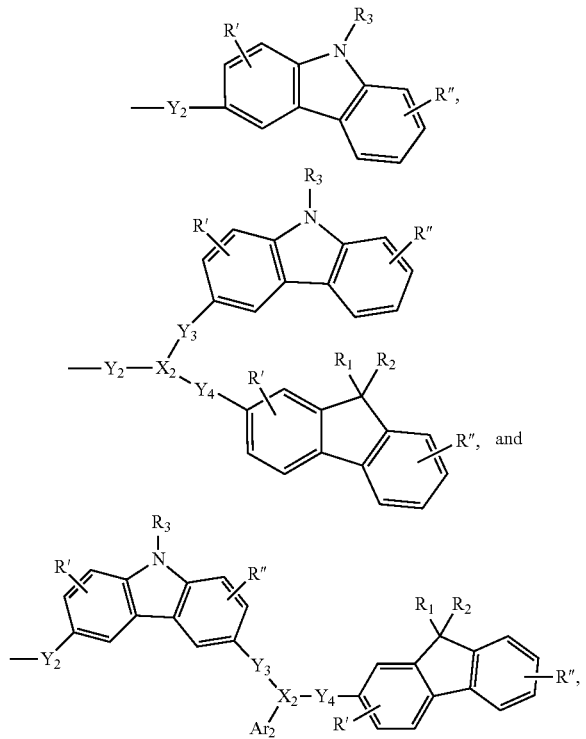

$Ar_1$ and $Ar_2$ are each independently selected from the group consisting of a substituted or unsubstituted $C_6$-$C_{50}$ aryl group and a substituted or unsubstituted $C_3$-$C_{50}$ heteroaryl group, $X_1$ and $X_2$ are each independently selected from the group consisting of nitrogen (N), boron (B), and phosphorus (P), $Y_1$, $Y_2$, $Y_3$, and $Y_4$ are each independently selected from the group consisting of a single bond, a substituted or unsubstituted $C_1$-$C_{50}$ alkylene group, a substituted or unsubstituted $C_2$-$C_{50}$ alkenylene group, a substituted or unsubstituted $C_2$-$C_{50}$ alkynylene group, a substituted or unsubstituted $C_3$-$C_{50}$ cycloalkylene group, a substituted or unsubstituted $C_1$-$C_{50}$ alkoxylene group, a substituted or unsubstituted $C_6$-$C_{50}$ arylene group, and a substituted or unsubstituted $C_3$-$C_{50}$ heteroarylene group, $R_1$, $R_2$, and $R_3$ are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_3$-$C_{50}$ cycloalkyl group, a substituted or unsubstituted $C_1$-$C_{50}$ alkoxy group, a substituted or unsubstituted $C_6$-$C_{50}$ aryl group, and a substituted or unsubstituted $C_3$-$C_{50}$ heteroaryl group, R' and R" are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_6$-$C_{50}$ aryl group, and a substituted or unsubstituted $C_3$-$C_{50}$ heteroaryl group, wherein at least two adjacent groups of $R_1$, $R_2$, $R_3$, R' and R" are linked to form a saturated or unsaturated ring, and

* is a binding site between the bridge unit and one selected from the group consisting of $Ar_1$, Z, and the fluorene group in Formula 1.

2. The dendrimer compound of claim 1, wherein $Ar_1$ and $Ar_2$ are each independently selected from the group consisting of a phenyl group, a halophenyl group, a cyanophenyl group, a phenoxyphenyl group, a $C_1$-$C_{15}$ alkyl phenyl group, a di($C_1$-$C_{15}$ alkyl) phenyl group, a $C_1$-$C_{15}$ alkoxy phenyl group, a di($C_1$-$C_{15}$ alkoxy) phenyl group, $C_6$-$C_{15}$ aryl phenyl group, a di($C_6$-$C_{15}$ aryl) phenyl group, a naphthyl group, a halonaphthyl group, a cyanonaphthyl group, a phenoxynaphthyl group, a $C_1$-$C_{15}$ alkyl naphthyl group, a di($C_1$-$C_{15}$ alkyl) naphthyl group, a $C_1$-$C_{15}$ alkoxy naphthyl group, a di($C_1$-$C_{15}$ alkoxy) naphthyl group, a $C_6$-$C_{15}$ aryl naphthyl group, a di($C_6$-$C_{15}$ aryl) naphthyl group, an anthryl group, a haloanthryl group, a cyanoanthryl group, a phenoxyanthryl group, a $C_1$-$C_{15}$ alkyl anthryl group, a di($C_1$-$C_{15}$ alkyl) anthryl group, a $C_1$-$C_{15}$ alkoxy anthryl group, a di($C_1$-$C_{15}$ alkoxy) anthryl group, a $C_6$-$C_{15}$ aryl anthryl group, a di($C_6$-$C_{15}$ aryl) anthryl group, a phenanthryl group, a halophenanthryl group, a cyanophenanthryl group, a phenoxyphenanthryl group, a $C_1$-$C_{15}$ alkyl phenanthryl group, a di($C_1$-$C_{15}$ alkyl) phenanthryl group, a $C_1$-$C_{15}$ alkoxy phenanthryl group, a di($C_1$-$C_{15}$ alkoxy) phenanthryl group, a $C_6$-$C_{15}$ aryl phenanthryl group, a di($C_6$-$C_{15}$ aryl) phenanthryl group, a fluorenyl group, a halofluorenyl group, a cyanofluorenyl group, a phenoxyfluorenyl group, a $C_1$-$C_{15}$ alkyl fluorenyl group, a di($C_1$-$C_{15}$ alkyl) fluorenyl group, a $C_1$-$C_{15}$ alkoxy fluorenyl group, a di($C_1$-$C_{15}$ alkoxy) fluorenyl group, a $C_6$-$C_{15}$ aryl fluorenyl group, a di($C_6$-$C_{15}$ aryl) fluorenyl group, a pyridyl group, a halopyridyl group, a cyanopyridyl group, a phenoxypyridyl group, a $C_1$-$C_{15}$ alkyl pyridyl group, a di($C_1$-$C_{15}$ alkyl) pyridyl group, a $C_1$-$C_{15}$ alkoxy pyridyl group, a di($C_1$-$C_{15}$ alkoxy) pyridyl group, a $C_6$-$C_{15}$ aryl pyridyl group, a di($C_6$-$C_{15}$ aryl) pyridyl group, a pyrenyl group, a halopyrenyl group, a cyanopyrenyl group, a phenoxypyrenyl group, a $C_1$-$C_{15}$ alkyl pyrenyl group, a di($C_1$-$C_{15}$ alkyl) pyrenyl group, a $C_1$-$C_{15}$ alkoxy pyrenyl group, a di($C_1$-$C_{15}$ alkoxy) pyrenyl group, a $C_6$-$C_{15}$ aryl pyrenyl group, a di($C_6$-$C_{15}$ aryl) pyrenyl group, a phenanthrolinyl group, a halophenanthrolinyl group, a cyanophenanthrolinyl group, a phenoxyphenanthrolinyl group, a $C_1$-$C_{15}$ alkyl phenanthrolinyl group, a di($C_1$-$C_{15}$ alkyl) phenanthrolinyl group, a $C_1$-$C_{15}$ alkoxy phenanthrolinyl group, a di($C_1$-$C_{15}$ alkoxy) phenanthrolinyl group, a $C_6$-$C_{15}$ aryl phenanthrolinyl group, a di($C_6$-$C_{15}$ aryl) phenanthrolinyl group, a quinolinyl group, a haloquinolinyl group, a cyanoquinolinyl group, a phenoxyquinolinyl group, a $C_1$-$C_{15}$ alkyl quinolinyl group, a di($C_1$-$C_{15}$ alkyl) quinolinyl group, a $C_1$-$C_{15}$ alkoxy quinolinyl group, a di($C_1$-$C_{15}$ alkoxy) quinolinyl group, a $C_6$-$C_{15}$ aryl quinolinyl group, a di($C_6$-$C_{15}$ aryl) quinolinyl group, a carbazolyl group, a halocarbazolyl group, a cyanocarbazolyl group, a phenoxycarbazolyl group, a $C_1$-$C_{15}$ alkyl carbazolyl group, a di($C_1$-$C_{15}$ alkyl) carbazolyl group, a $C_1$-$C_{15}$ alkoxy carbazolyl group, a di($C_1$-$C_{15}$ alkoxy) carbazolyl group, a $C_6$-$C_{15}$ aryl carbazolyl group, and a di($C_6$-$C_{15}$ aryl) carbazolyl group.

3. The dendrimer compound of claim 1, wherein $Ar_1$ and $Ar_2$ are each independently selected from the group consisting of a phenyl group, a halophenyl group, a cyanophenyl group, a biphenyl group, a dimethylfluorenyl group, a carbazolyl group, and a diphenylcarbazolyl group.

4. The dendrimer compound of claim 1, wherein $X_1$ and $X_2$ are nitrogen (N).

5. The dendrimer compound of claim 1, wherein $Y_1$, $Y_2$, $Y_3$, and $Y_4$ are each independently selected from the group consisting of a single bond, a methylene group, an ethylene group, a propylene group, an isobutylene group, a sec-butylene group, a phenylene group, a methylphenylene group, an ethylphenylene group, an o-, m- and p-fluorophenylene group, a dichlorophenylene group, a cyanophenylene group, a dicyanophenylene group, a trifluoromethoxyphenylene group, a biphenylene group, a halobiphenylene group, a cyanobiphenylene group, a methylbiphenylene group, an ethylbiphenylene group, a methoxybiphenylene group, and an ethoxybiphenylene group.

6. The dendrimer compound of claim 1, wherein $Y_1$, $Y_2$, $Y_3$, and $Y_4$ are each independently selected from the group consisting of a single bond, a methylene group, an ethylene group, a propylene group, an isobutylene group, a sec-butylene group, a phenylene group, or a diphenylene group.

7. The dendrimer compound of claim 1, wherein $R_1$, $R_2$, $R_3$, R', and R" are each independently selected from the group consisting of a hydrogen atom, a heavy hydrogen atom, deuterium, tritium, a halogen atom, a cyano group, an amino group, a methyl group, an ethyl group, a propyl group, an isobutyl group, a sec-butyl group, a phenyl group, a methylphenyl group, an ethylphenyl group, an o-, m- and p-fluorophenyl group, a dichlorophenyl group, a cyanophenyl group, a dicyanophenyl group, a trifluoromethoxyphenyl group, a biphenyl group, a halobiphenyl group, a cyanobiphenyl group, a methylbiphenyl group, an ethylbiphenyl group, a methoxybiphenyl group, and an ethoxybiphenyl group.

8. The dendrimer compound of claim 1, wherein $R_1$, $R_2$, $R_3$, R', and R" are each independently selected from the group consisting of a hydrogen atom, a heavy hydrogen atom, deuterium, tritium, a halogen atom, a cyano group, an amino group, a methyl group, an ethyl group, a propyl group, an isobutyl group, a sec-butyl group, a phenyl group, or a biphenyl group.

9. The dendrimer compound of claim 1, wherein the fluorene-based functional group is selected from the group consisting of functional groups represented by Formulae 2 to 6 below:

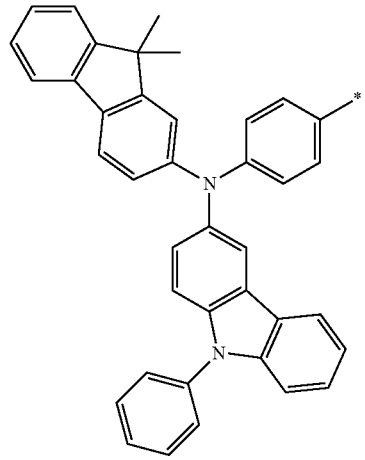

<Formula 2>

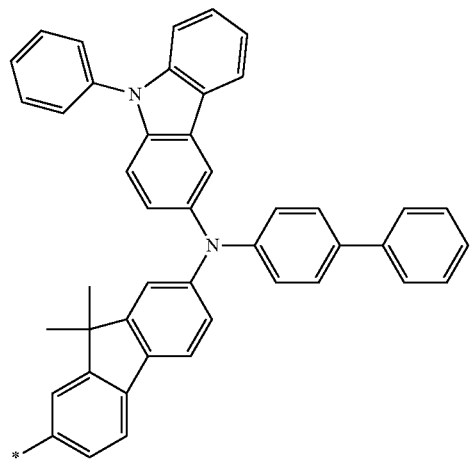

<Formula 3>

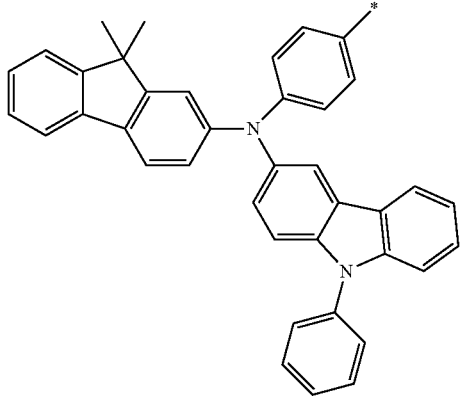

<Formula 4>

<Formula 5>

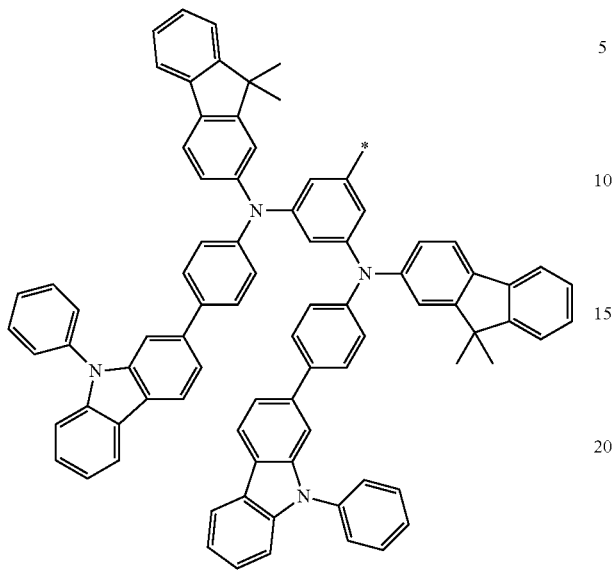

<Formula 6>

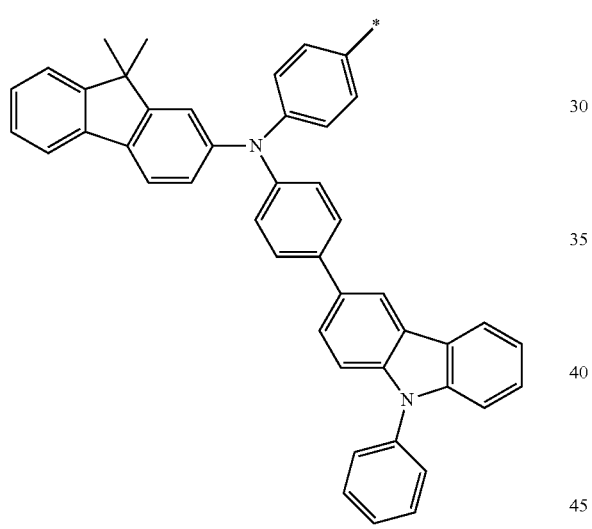

where, * is a binding site with the bridge unit.

10. The dendrimer compound of claim 1, wherein the bridge unit comprises a functional group selected from the group consisting of functional groups represented by Formulas 7 to 10 below:

<Formula 7>

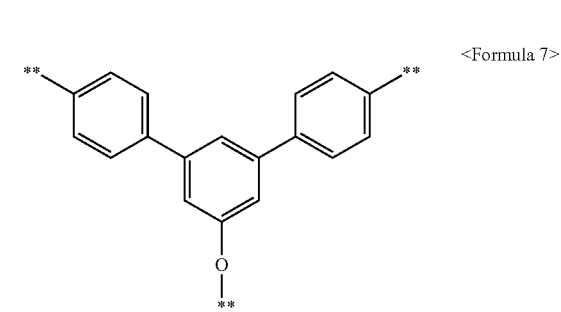

<Formula 8>

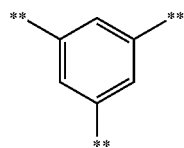

<Formula 9>

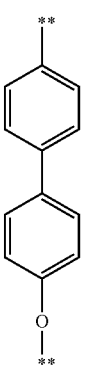

<Formula 10>

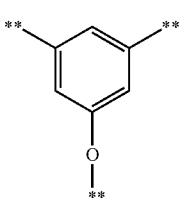

where ** is a binding site with an adjacent unit.

11. The dendrimer compound of claim 1, wherein the average molecular weight of the dendrimer compound is from about 1,000 to 100,000.

12. The dendrimer compound of claim 1, wherein the dendrimer further comprises a surface unit that is selected from the group consisting of a substituted or unsubstituted $C_6$-$C_{50}$ aryl group and a substituted or unsubstituted $C_3$-$C_{50}$ heteroaryl group at the end of the dendron unit.

13. The dendrimer compound of claim 1, wherein the dendrimer is selected from the group consisting of compounds represented by Dendrimer 1 to 6:

<Dendrimer 1>
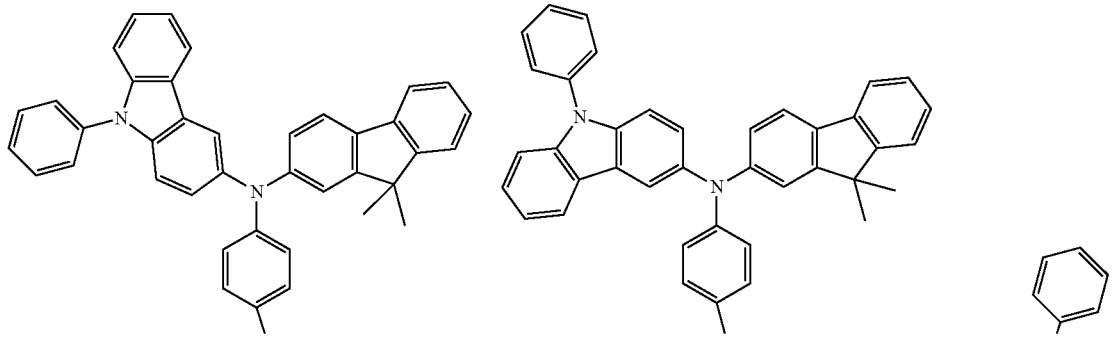
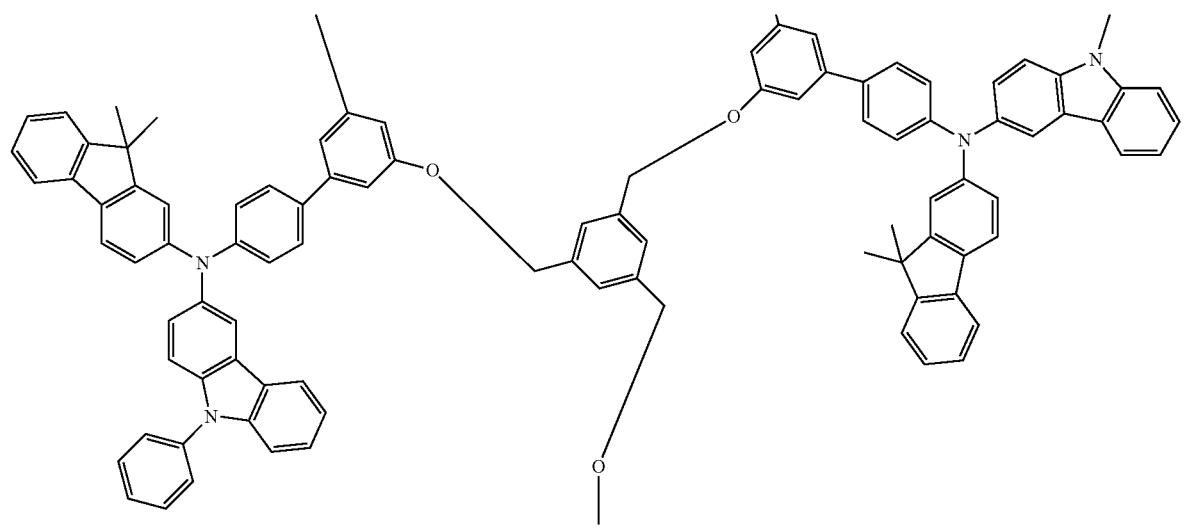
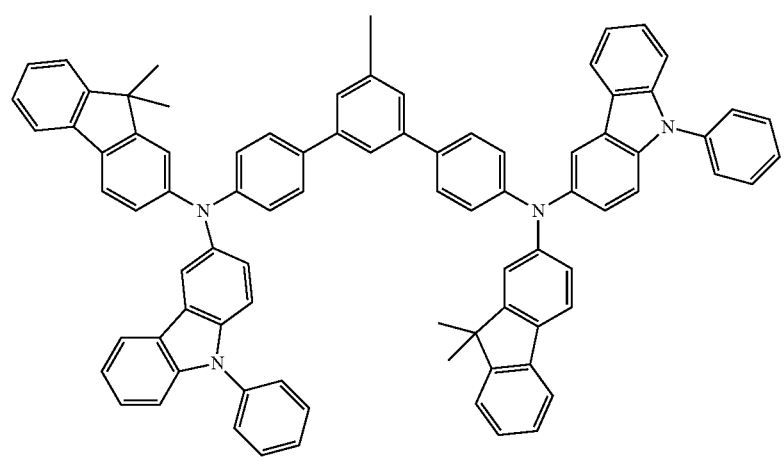

-continued
<Dendrimer 2>
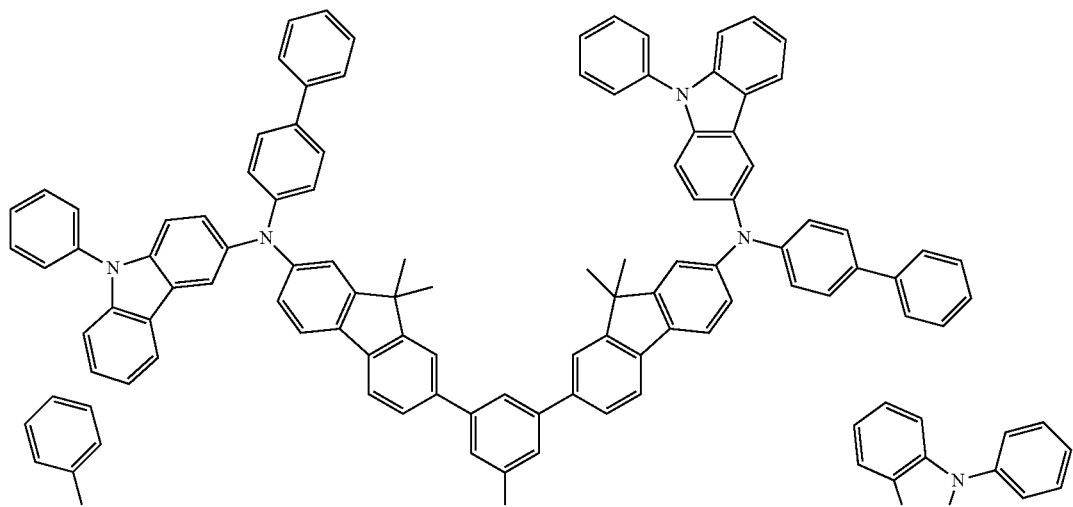
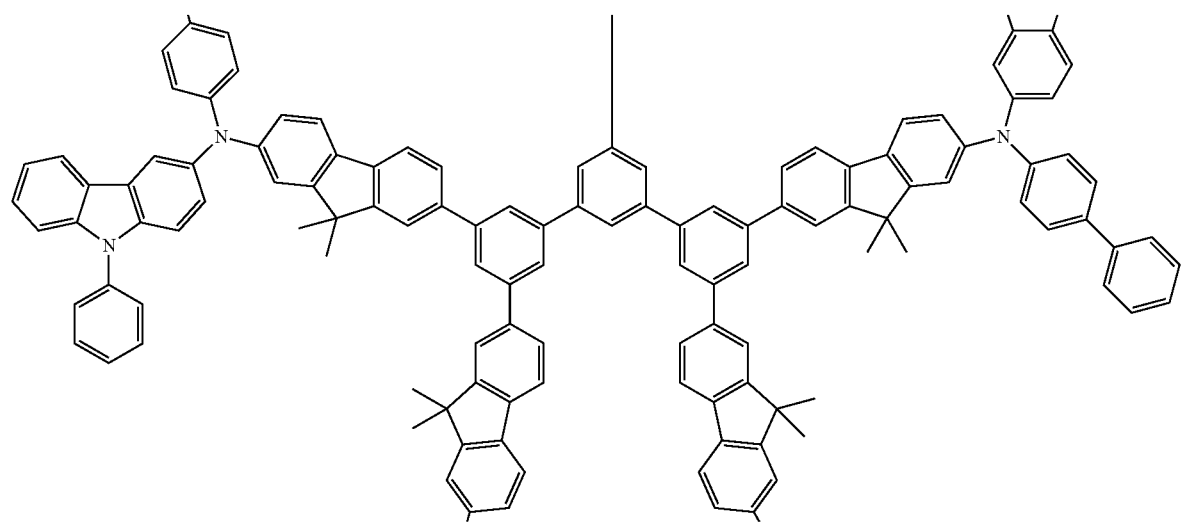
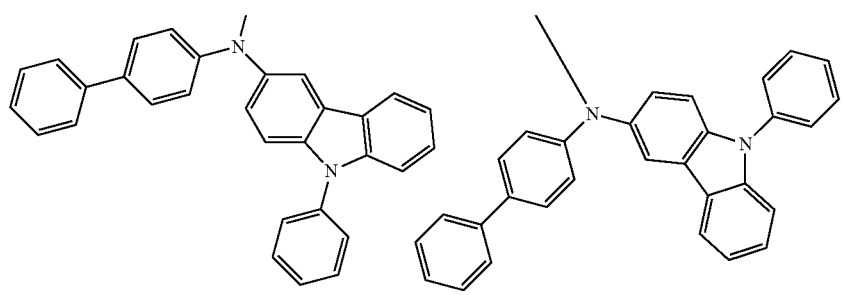

-continued
<Dendrimer 3>
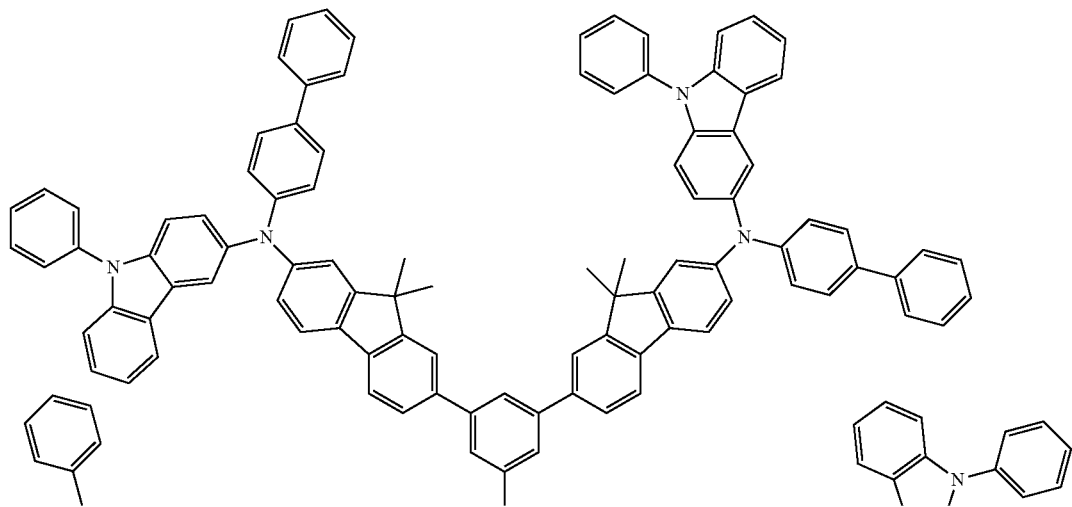
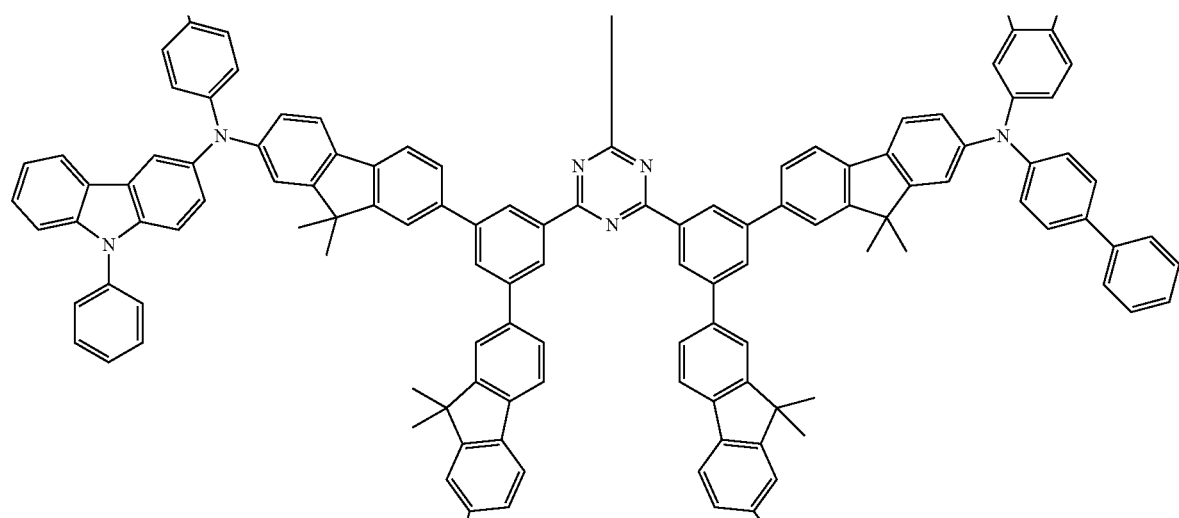
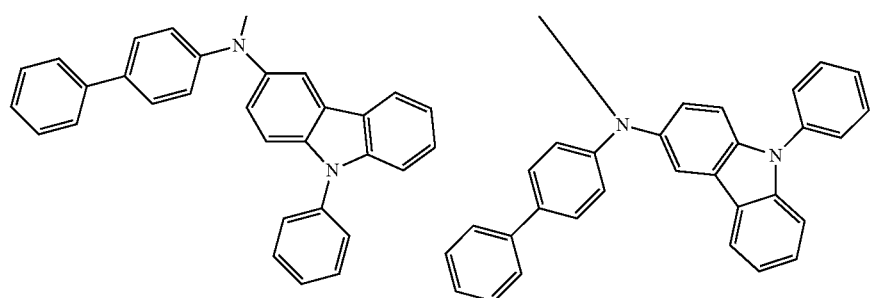

-continued
<Dendrimer 4>
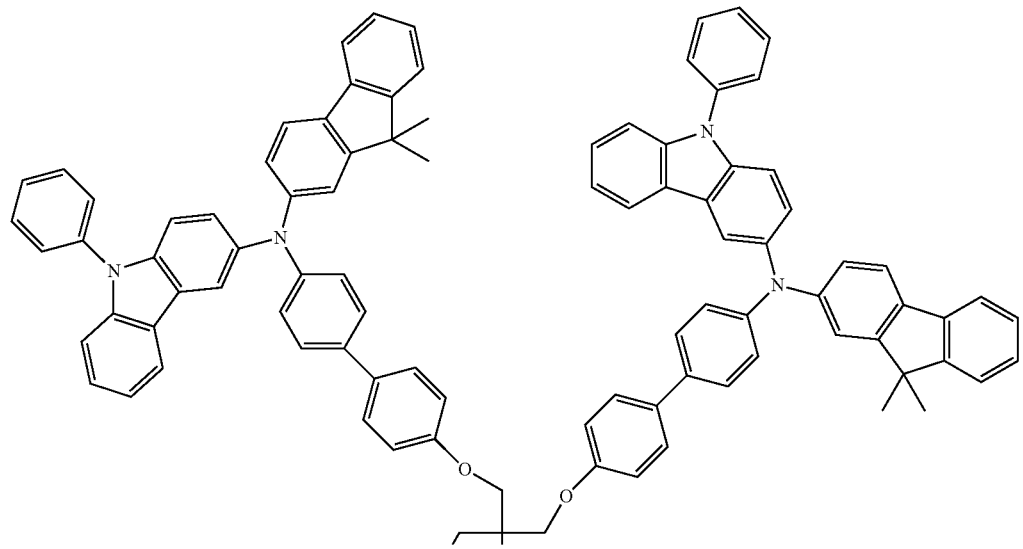
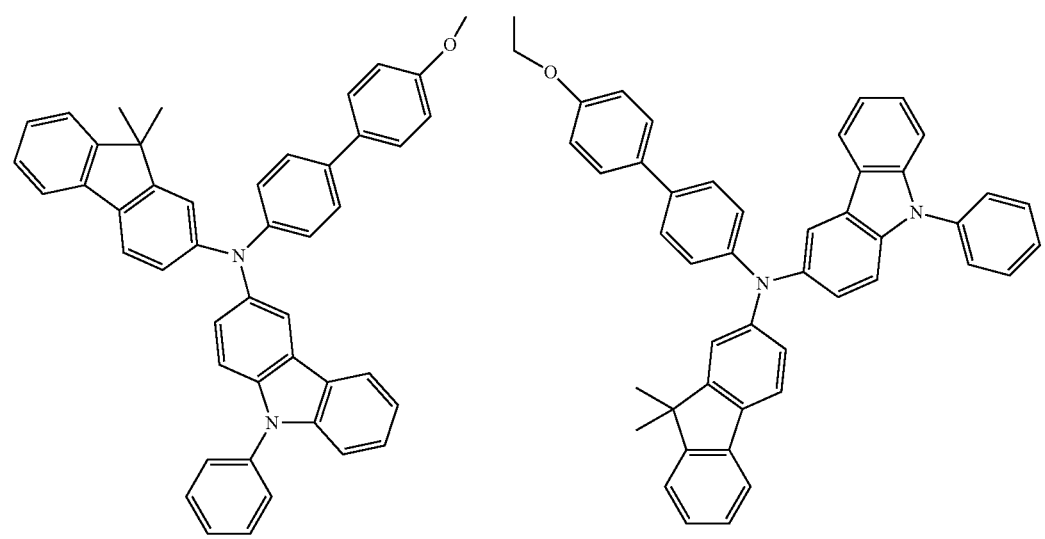
<Dendrimer 5>
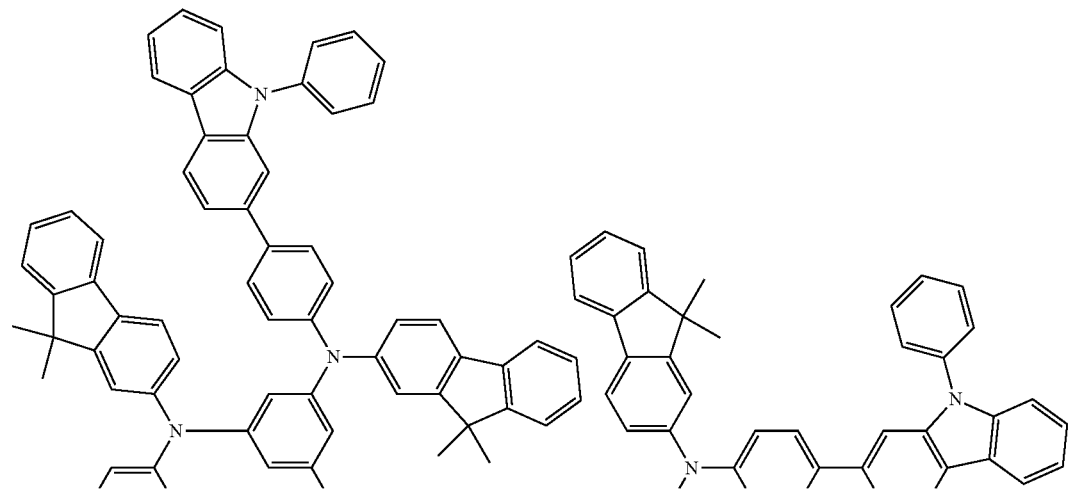

-continued
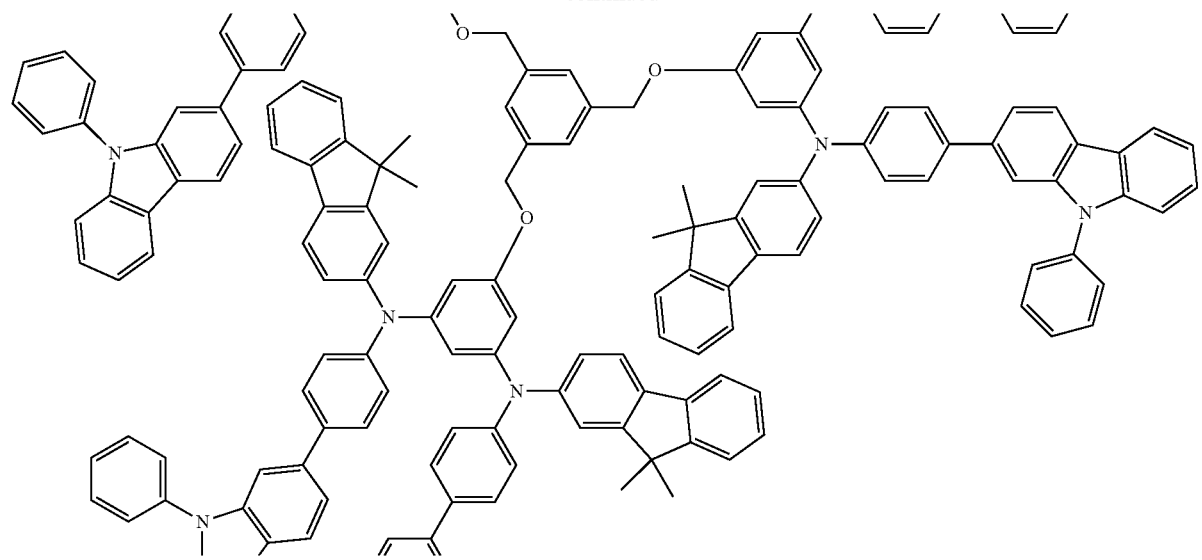
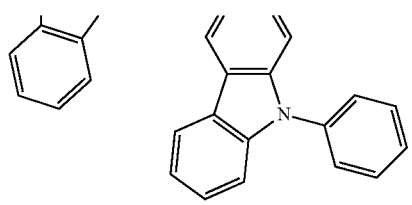
<Dendrimer 6>
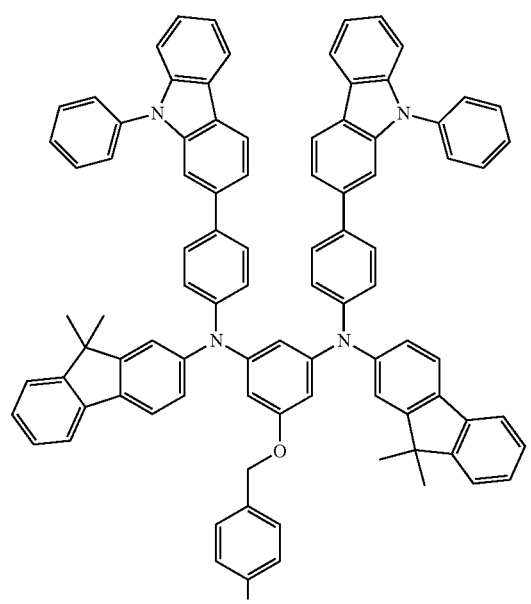

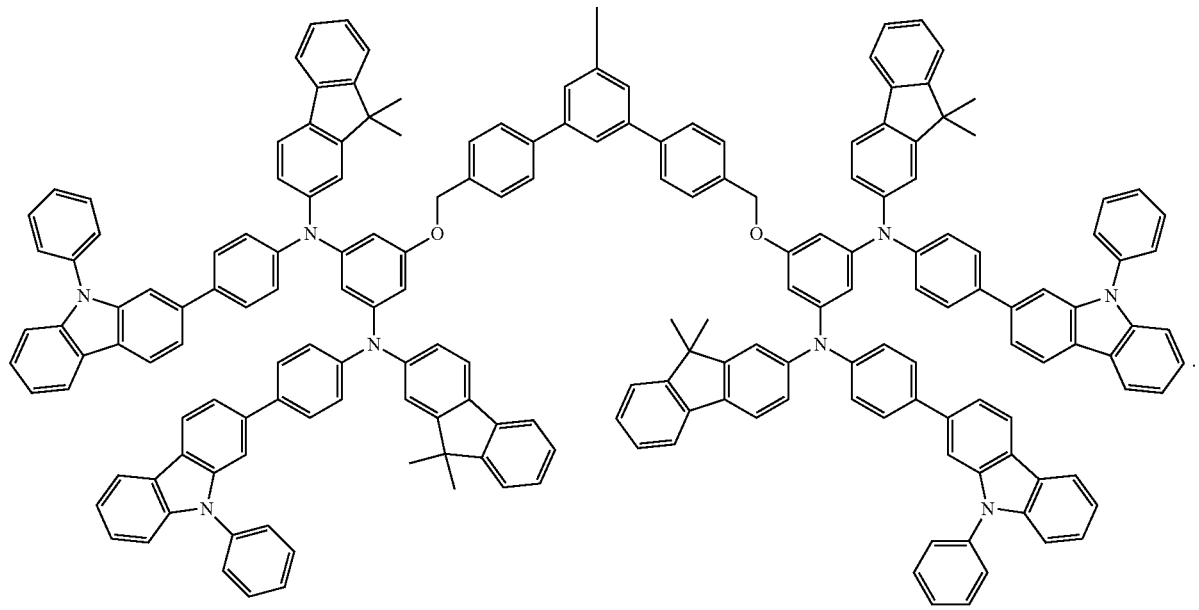

14. An organic light-emitting device comprising a pair of electrodes and an organic layer interposed between the electrodes, wherein the organic layer comprises a dendrimer compound according to claim 1.

15. The organic light-emitting device of claim 14, wherein the organic layer comprises at least one selected from the group consisting of an emission layer, a hole injection layer, and a hole transport layer.

16. The organic light-emitting device of claim 14, wherein the organic layer comprises an emission layer.

17. The organic light-emitting device of claim 14, wherein the dendrimer is a host of a green or red dopant.

18. An organic light-emitting device comprising a pair of electrodes and an organic layer interposed between the electrodes, wherein the organic layer comprises a dendrimer compound according to claim 12.

19. The organic light-emitting device of claim 18, wherein the organic layer comprises at least one selected from the group consisting of an emission layer, a hole injection layer, and a hole transport layer.

20. A dendrimer compound comprising a core unit, a bridge unit, and a dendron unit, wherein the core unit comprises a trivalent or tetravalent functional group selected from the group consisting of a substituted or unsubstituted $C_1$-$C_{50}$ aliphatic hydrocarbon, a substituted or unsubstituted $C_6$-$C_{50}$ aromatic hydrocarbon, and a substituted or unsubstituted $C_3$-$C_{50}$ hetero aromatic hydrocarbon, wherein the bridge unit comprises a functional group selected from the group consisting of functional groups represented by Formulas 7 to 10 below:

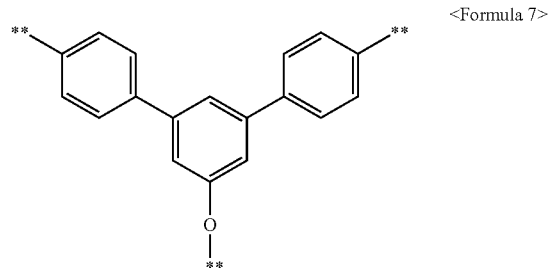

<Formula 7>

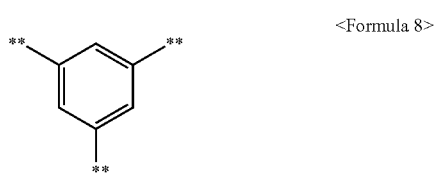

<Formula 8>

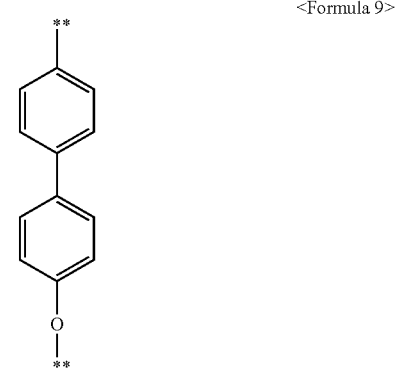

<Formula 9>

-continued

<Formula 10>

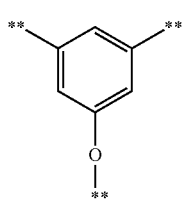

where ** is a binding site with an adjacent unit
and wherein the dendron unit comprises a monovalent fluorene-based functional group represented by Formula 1 below:

<Formula 1>

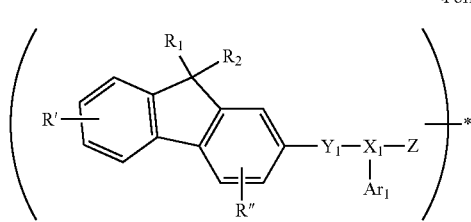

where Z is selected from the group consisting of

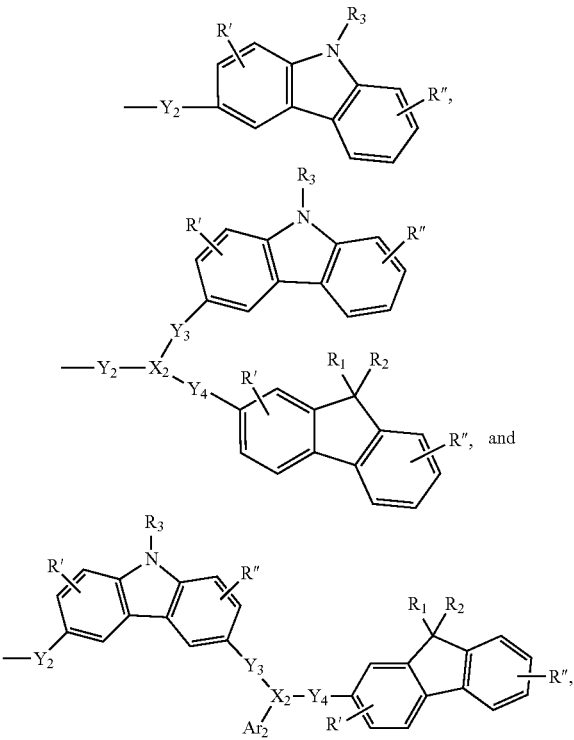

$Ar_1$ and $Ar_2$ are each independently selected from the group consisting of a substituted or unsubstituted $C_6$-$C_{50}$ aryl group and a substituted or unsubstituted $C_3$-$C_{50}$ heteroaryl group, $X_1$ and $X_2$ are each independently selected from the group consisting of nitrogen (N), boron (B), and phosphorus (P), $Y_1, Y_2, Y_3,$ and $Y_4$ are each independently selected from the group consisting of a single bond, a substituted or unsubstituted $C_1$-$C_{50}$ alkylene group, a substituted or unsubstituted $C_2$-$C_{50}$ alkenylene group, a substituted or unsubstituted $C_2$-$C_{50}$ alkynylene group, a substituted or unsubstituted $C_3$-$C_{50}$ cycloalkylene group, a substituted or unsubstituted $C_1$-$C_{50}$ alkoxylene group, a substituted or unsubstituted $C_6$-$C_{50}$ arylene group, and a substituted or unsubstituted $C_3$-$C_{50}$ heteroarylene group, $R_1, R_2,$ and $R_3$ are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_3$-$C_{50}$ cycloalkyl group, a substituted or unsubstituted $C_1$-$C_{50}$ alkoxy group, a substituted or unsubstituted $C_6$-$C_{50}$ aryl group, and a substituted or unsubstituted $C_3$-$C_{50}$ heteroaryl group, R' and R" are each independently selected from the group consisting of a hydrogen atom, a heavy hydrogen atom, deuterium, tritium, a halogen atom, a cyano group, an amino group, a nitro group, a hydroxyl group, a carboxyl group, a substituted or unsubstituted $C_1$-$C_{50}$ alkyl group, a substituted or unsubstituted $C_6$-$C_{50}$ aryl group, and a substituted or unsubstituted $C_3$-$C_{50}$ heteroaryl group, wherein at least two adjacent groups of $R_1, R_2, R_3$, R' and R" are linked to form a saturated or unsaturated ring, and

* is a binding site between the bridge unit and one selected from the group consisting of $Ar_1$, Z, and the fluorene group in Formula 1.

21. An organic light-emitting device comprising a pair of electrodes and an organic layer interposed between the electrodes, wherein the organic layer comprises a dendrimer compound according to claim 20.

* * * * *